US009520812B2

(12) United States Patent  (10) Patent No.: US 9,520,812 B2
Maeda  (45) Date of Patent:  Dec. 13, 2016

(54) ELECTRONIC DEVICE, ELECTRONIC APPARATUS, AND METHOD OF MANUFACTURING ELECTRONIC DEVICE

(71) Applicant: Seiko Epson Corporation, Tokyo (JP)

(72) Inventor: Yoshio Maeda, Suwa (JP)

(73) Assignee: Seiko Epson Corporation (JP)

( * ) Notice: Subject to any disclaimer, the term of this patent is extended or adjusted under 35 U.S.C. 154(b) by 732 days.

(21) Appl. No.: 13/905,316

(22) Filed: May 30, 2013

(65) Prior Publication Data

US 2013/0320803 A1  Dec. 5, 2013

(30) Foreign Application Priority Data

May 31, 2012 (JP) ................. 2012-124576

(51) Int. Cl.
*H02N 1/08* (2006.01)
*H05K 13/00* (2006.01)
*B81B 7/02* (2006.01)
*H02N 1/00* (2006.01)
*B81B 7/00* (2006.01)
*B81C 1/00* (2006.01)
*G01C 19/5719* (2012.01)

(52) U.S. Cl.
CPC ............ *H02N 1/008* (2013.01); *B81B 7/0074* (2013.01); *B81B 7/02* (2013.01); *B81C 1/00293* (2013.01); *G01C 19/5719* (2013.01); *H05K 13/00* (2013.01); *B81C 2201/019* (2013.01); *B81C 2203/051* (2013.01); *H01L 2224/48091* (2013.01); *H01L 2924/1461* (2013.01); *Y10T 29/49002* (2015.01)

(58) Field of Classification Search
CPC ...... B81B 7/0074; B81B 7/02; B81C 1/00293; G01C 19/5719; H02K 13/00
USPC ........................................ 310/300
See application file for complete search history.

(56) References Cited

U.S. PATENT DOCUMENTS

| 7,004,025 | B2 | 2/2006 | Tamura | |
|---|---|---|---|---|
| 7,159,459 | B2 | 1/2007 | Gogoi | |
| 7,223,624 | B2 | 5/2007 | Wu et al. | |
| 2005/0155428 | A1* | 7/2005 | Kato | .............. G01C 19/5719 73/514.32 |
| 2008/0049296 | A1* | 2/2008 | Stalford | ............... B81B 7/02 359/290 |
| 2009/0194768 | A1* | 8/2009 | Leedy | ................ B81B 7/02 257/48 |
| 2010/0120177 | A1* | 5/2010 | Zhuang | .............. H01L 22/12 438/14 |

(Continued)

FOREIGN PATENT DOCUMENTS

| JP | 07-014479 | 1/1995 |
|---|---|---|
| JP | 2002005950 A | 1/2002 |

(Continued)

*Primary Examiner* — Terrance Kenerly
(74) *Attorney, Agent, or Firm* — Harness, Dickey & Pierce, P.L.C.

(57) ABSTRACT

An electronic device includes a first base body, a second base body, a third base body held between the first base body and the second base body, a first functional element disposed in a first cavity surrounded by the first base body and the third base body, and a second functional element disposed in a second cavity surrounded by the second base body and the third base body.

15 Claims, 24 Drawing Sheets

(56) References Cited

U.S. PATENT DOCUMENTS

2010/0312468 A1* 12/2010 Withanawasam ......... B81B 7/02
                                                          701/408
2011/0147859 A1   6/2011  Tanaka et al.
2011/0290023 A1  12/2011  Takagi
2014/0048922 A1   2/2014  Tanaka et al.

FOREIGN PATENT DOCUMENTS

| JP | 2003-028889 A | 1/2003 |
| JP | 2005-268758 A | 9/2005 |
| JP | 2005-345245 A | 12/2005 |
| JP | 2009-054824 A | 3/2009 |
| JP | 2009-264760 A | 11/2009 |
| JP | 2010-019693 A | 1/2010 |
| JP | 2010-054210 A | 3/2010 |
| JP | 2011-146687 A | 7/2011 |
| JP | 2011-247729 A | 12/2011 |

* cited by examiner

ELECTRONIC DEVICE, ELECTRONIC APPARATUS, AND METHOD OF MANUFACTURING ELECTRONIC DEVICE

BACKGROUND

1. Technical Field

The present invention relates to an electronic device, an electronic apparatus, and a method of manufacturing the electronic device.

2. Related Art

In recent years, there have been developed an electronic device such as an inertia sensor for detecting a physical quantity using, for example, a silicon MEMS (micro-electromechanical system) technology. Such an electronic device is used for, for example, a camera-shake correction function of a digital still camera (DSC), a car navigation system, and an action input device in a game machine.

In the field of such an electronic device, there is a demand for miniaturization and space saving of the device. For example, JP-A-2002-5950 discloses an electronic device (a composite element sensor) provided with, for example, an angular velocity sensor and an acceleration sensor disposed on the same substrate.

SUMMARY

An advantage of some aspects of the invention is to provide an electronic device, which is the electronic device (the composite element sensor) described above, and makes a greater contribution to miniaturization and space saving of the device. Another advantage of some aspects of the invention is to provide a method of manufacturing the electronic device described above. Still another advantage of some aspects of the invention is to provide an electronic apparatus including the electronic device described above.

The invention can be implemented as the following forms or application examples.

Application Example 1

An electronic device according to this application example includes a first base body, a second base body, a third base body held between the first base body and the second base body, a first functional element disposed in a first cavity surrounded by the first base body and the third base body, and a second functional element disposed in a second cavity surrounded by the second base body and the third base body.

According to such an electronic device as described above, since the electronic device having the first functional element and the second functional element stacked on each other can be provided, it is possible to provide an electronic device making a contribution to miniaturization and space saving of the device.

Further, according to such an electronic device as described above, since the electronic device having the first functional element and the second functional element stacked on each other can be provided, the detection axes of the functional elements can easily be arranged with high alignment accuracy in the manufacturing process. Therefore, it is possible to provide an electronic device simplifying the manufacturing process and having the detection axes with high alignment accuracy.

Further, according to such an electronic device as described above, since a cavity sealed in a desired pressure atmosphere can be formed by performing the stacking process in the desired pressure atmosphere, the cavity sealing can be performed with an easier method. Therefore, an electronic device capable of simplifying the manufacturing process can be provided.

Further, according to such an electronic device as described above, since the first functional element and the second functional element are not formed on the same substrate, it is possible to provide an electronic device capable of preventing the reliability of the functional elements mounted therein from degrading.

For example, in the case in which the gyro sensor is included in at least one of the first functional element and the second functional element, it is necessary to drive the gyro sensor to vibrate for the requirement of the manufacturing process. In the case in which the first functional element and the second functional element are formed on the same substrate, there is a possibility that the vibration propagates to the other functional element to degrade the reliability of the functional element. In contrast, according to the electronic device related to this application example, since the first base body and the second base body are respectively provided with the functional elements, it is possible to prevent the reliability of the elements from degrading due to the vibration and so on.

Further, according to such an electronic device as described above, since the first functional element and the second functional element are not formed on the same substrate, an electronic device with the influence on the yield ratio reduced can be provided.

For example, even in the case in which only either one of the first functional element and the second functional element is defective, since the first functional element and the second functional element are formed on the same substrate, the yield ratio is dramatically degraded, and thus the structure of the electronic device significantly affects the yield ratio. In contrast, according to the electronic device related to this application example, the functional elements are respectively provided to the first base body and the second base body. Therefore, even in the case in which a failure occurs in one of the functional elements, it is not required to treat the other of the functional elements as a defective, and therefore, the influence on the yield ratio can be reduced.

Application Example 2

The electronic device according to the application example may be configured such that the first base body and the second base body are each provided with an alignment mark.

According to this configuration, since the alignment can reliably be performed in the process of stacking the first base body, the second base body, and the third base body on each other, it is possible for the functional elements to have the detection axes aligned with higher alignment accuracy. Therefore, an electronic device with further improved reliability can be provided.

Application Example 3

The electronic device according to the application example may be configured such that the first functional element detects a physical quantity different from a physical quantity detected by the second functional element.

Application Example 4

The electronic device according to the application example may be configured such that the first functional element is the same as the second functional element, and the third base body has an opening section adapted to communicate the first cavity and the second cavity with each other.

Application Example 5

The electronic device according to the application example may be configured such that a material of the first and second base bodies is glass, and a material of the third base body is one of silicon and glass.

According to such an electronic device as described above, in the electronic device using glass and silicon having respective thermal expansion coefficients different from each other, it is possible to sandwich the third base body made of silicon with the first base body and the second base body made of glass from the directions of the both surfaces. Thus, the stress caused by the difference in thermal expansion coefficient is cancelled (offset) in a heating process in the manufacturing process, and therefore, it is possible to provide an electronic device having improved reliability.

Application Example 6

The electronic device according to the application example may be configured such that the electronic device further includes a substrate, which includes an integrated circuit adapted to process signals of the first and second functional elements, and to which the first base body is mounted, and a mold section adapted to mold the first, second, and third base bodies and the substrate.

Application Example 7

A method of manufacturing an electronic device according to this application example includes a first preparation step of preparing a first structure by preparing a first base body and then forming a first functional element on the first base body, a second preparation step of preparing a second structure by preparing a second base body and then forming a second functional element on the second base body, a third preparation step of preparing a third base body, and a stacking step of housing the first functional element in a first cavity surrounded by the first base body and the third base body, and housing the second functional element in a second cavity surrounded by the second base body and the third base body by stacking the first base body, the second base body, and the third base body on each other so that the third base body is held between the first base body and the second base body.

According to such a method of manufacturing an electronic device as described above, since the electronic device having the first functional element and the second functional element stacked on each other can be provided, it is possible to provide a method of manufacturing an electronic device making a contribution to miniaturization and space saving of the device.

Further, according to such a method of manufacturing an electronic device as described above, since the electronic device having the first functional element and the second functional element stacked on each other can be provided, the detection axes of the functional elements can easily be arranged with high alignment accuracy. Therefore, it is possible to provide an electronic device simplifying the manufacturing process and having the detection axes with high alignment accuracy.

Further, according to such a method of manufacturing an electronic device as described above, since a cavity sealed in a desired pressure atmosphere can be formed by performing the stacking process in the desired pressure atmosphere, the cavity sealing can be performed with an easier method.

Further, according to such a method of manufacturing an electronic device as described above, since the first functional element and the second functional element are not formed on the same substrate, but are individually provided to the first base body and the second base body, it is possible to prevent the reliability of the functional elements mounted thereon from degrading.

For example, in the case in which the gyro sensor is included in at least one of the first functional element and the second functional element, it is necessary to drive the gyro sensor to vibrate for the requirement of the manufacturing process. In the case in which the first functional element and the second functional element are formed on the same substrate, there is a possibility that the vibration propagates to the other functional element to degrade the reliability of the functional element. In contrast, according to the method of manufacturing an electronic device related to this application example, it is possible to prevent the reliability of the element from degrading due to the vibration and so on.

Further, according to such a method of manufacturing an electronic device as described above, since the first functional element and the second functional element are not formed on the same substrate, the influence on the yield ratio can be reduced.

For example, even in the case in which only either one of the first functional element and the second functional element is defective, since the first functional element and the second functional element are formed on the same substrate, the yield ratio is dramatically degraded. In contrast, according to the method of manufacturing an electronic device related to this application example, the functional elements are respectively provided to the first base body and the second base body. Therefore, even in the case in which a failure occurs in one of the functional elements, it is not required to treat the other of the functional elements as a defective, and therefore, the influence on the yield ratio can be reduced.

Application Example 8

The method of manufacturing an electronic device according to the application example may be configured such that the stacking step includes a steps of bonding the first base body and the third base body to each other in a first pressure atmosphere to thereby form the first cavity of the first pressure atmosphere, and a step of bonding the second base body and the third base body to each other in a second pressure atmosphere to thereby form the second cavity of the second pressure atmosphere, and the first pressure atmosphere and the second pressure atmosphere are different in pressure from each other.

According to such a method of manufacturing an electronic device as described above, even in the case in which the first cavity and the second cavity are different in pressure atmosphere from each other, by performing the bonding process of the first base body and the third base body in the desired pressure atmosphere, and performing the bonding process of the second base body and the third base body in the desired pressure atmosphere, it is possible to set the atmosphere in each cavity to the desired atmosphere.

Application Example 9

The method of manufacturing an electronic device according to the application example may be configured such that the first preparation step further includes a step of forming at least one first alignment mark, the second preparation step further includes a step of forming at least one second alignment mark, the first alignment mark and the second alignment mark are simultaneously formed at the time of formation of the first functional element and the second functional element, respectively, and the stacking step further includes a step of performing alignment by visually detecting the first alignment mark and the second alignment mark.

According to this configuration, since the alignment can reliably be performed in the process of stacking the first base body, the second base body, and the third base body on each other, it is possible for the functional elements to have the detection axes aligned with higher alignment accuracy.

Application Example 10

The method of manufacturing an electronic device according to the application example may be configured such that in the first preparation step, a first wafer having a plurality of the first structures in a first element region is prepared, in the second preparation step, a second wafer having a plurality of the second structures in a second element region is prepared, in the third preparation step, a third wafer having a plurality of the third base bodies in a third element region is prepared, and there is further included a step of segmenting the first wafer, the second wafer, and the third wafer stacked on each other in the stacking step after the stacking step.

Application Example 11

The method of manufacturing an electronic device according to the application example may be configured such that the first alignment mark is formed outside the first element region of the first wafer, and the second alignment mark is formed outside the second element region of the second wafer.

According to this configuration, since there is no need to provide the alignment marks in the electronic device, further miniaturization and space saving can be achieved. Further, since the alignment process can be performed wafer by wafer, the manufacturing can more easily be performed compared to the case of individually performing the visual check and then performing the alignment.

Application Example 12

An electronic apparatus according to this application example includes the electronic device according to the above application example.

According to such an electronic apparatus as described above, it is possible to include an electronic device making a contribution to miniaturization and space saving of the device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be explained in detail with reference to the accompanying drawings. It should be noted that the embodiments described below do not unreasonably limit the contents of the invention as set forth in the appended claims. Further, all of the constituents explained hereinafter are not necessarily essential elements of the invention.

1. Configuration of Electronic Device

1.1. First Embodiment

Figure 1:
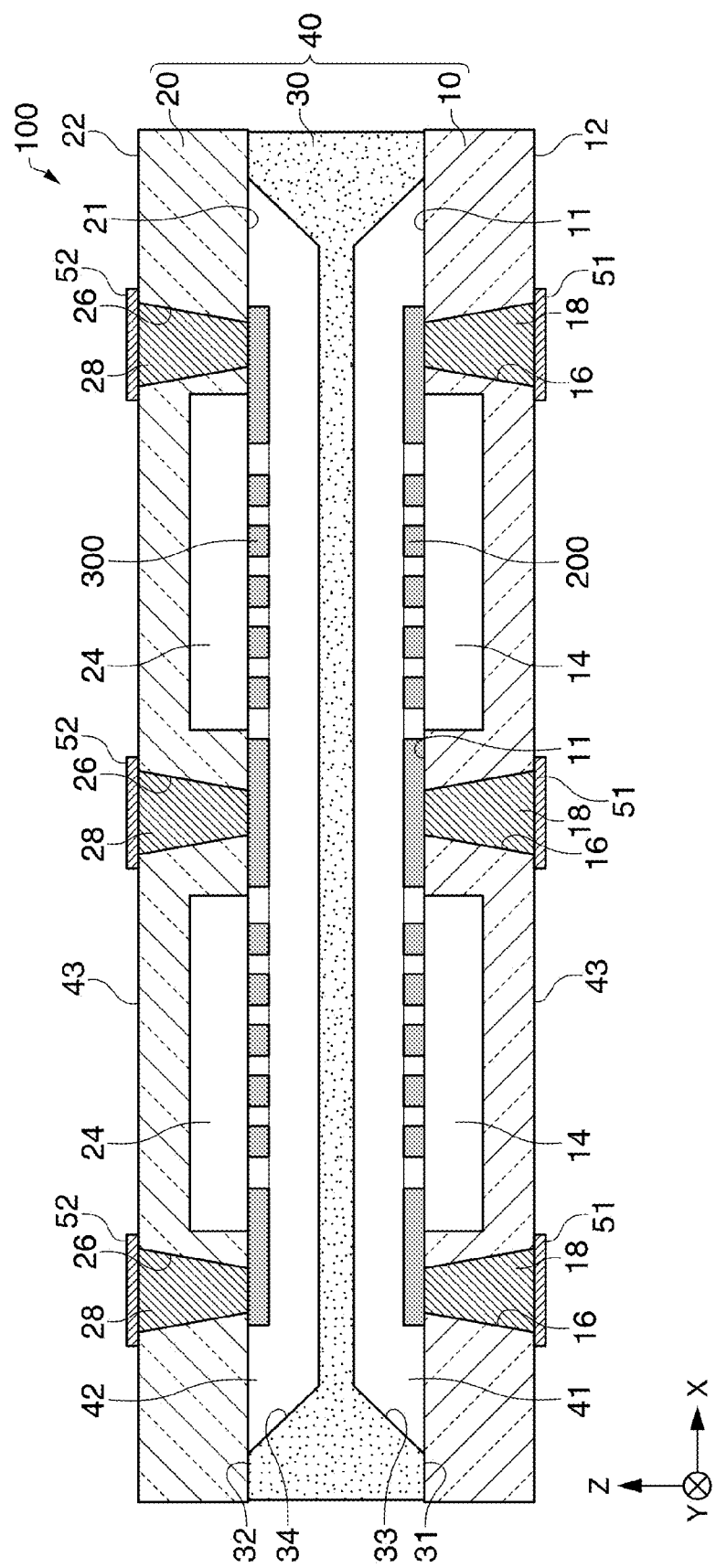
FIG. 1 is a cross-sectional view schematically showing an electronic device according to a first embodiment of the invention.

Firstly, an electronic device according to a first embodiment will be explained with reference to the accompanying drawings. FIG. 1 is a cross-sectional view schematically showing an electronic device 100 according to the first embodiment. For the sake of convenience, in the drawing, the X axis, the Y axis, and the Z axis are shown as the three axes perpendicular to each other.

As shown in FIG. 1, the electronic device 100 includes a first cavity 41 composed of a first base body 10, a second base body 20, and a third base body 30, a package 40 having a second cavity 42, and first and second functional elements 200, 300 housed in the package 40. It should be noted that, for the sake of convenience, the first and second functional elements 200, 300 are simplified in FIG. 1.

The electronic device 100 is a composite element sensor having a plurality of physical quantity detection sensors mounted in the same package (the same substrate). The first and second functional elements 200, 300 housed by the electronic device 100 can be sensor elements for detecting respective physical quantities different from each other, or can be sensor elements for detecting the same physical quantity. The first functional element 200 can be different from the second functional element 300, or can be the same as the second functional element 300. Further, although not shown in the drawings, a plurality of functional elements can be disposed in the same cavity. The details of the functional elements will be described later.

As shown in FIG. 1, the first base body 10 is a member provided with the first functional element 200. The first base body 10 has a first surface 11, as the surface to which the third base body 30 is bonded, and a second surface 12 on the opposite side to the first surface 11. The first surface 11 of the first base body 10 is a surface for supporting the first functional element 200, and at the same time is a surface constituting the first cavity 41. The first surface 11 of the first base body 10 is provided with first recessed sections 14, and the first functional element 200 is mounted above the first recessed sections 14. Due to the first recessed sections 14, the first functional element 200 can move only in a desired direction without being hindered by the first base body 10.

The material of the first base body 10 is not particularly limited, and for example, a glass substrate, a silicon substrate, and a quartz crystal substrate can be used as the first base body 10. From a viewpoint of workability and so on, glass can be used as the material of the first base body 10.

The first base body 10 is provided with a plurality of through holes 16 penetrating the first surface 11 and the second surface 12. In the example shown in the drawing, the through holes 16 penetrate the first base body 10 in the Z-axis direction. The inner wall surface of each of the through holes 16 can have a tapered shape as shown in the drawing. It should be noted that the planer shape (the shape viewed from the Z-axis direction) of the opening section of each of the through holes 16 is not particularly limited, but can have a circular shape or a rectangular shape (e.g., a square shape). Here, as shown in FIG. 1, the through holes 16 can be disposed so that the first functional element 200 and the opening section partially overlap each other. Further, although not shown in the drawing, the inner wall surface of each of the through holes 16 can be provided with an electrically-conductive layer extending from the inside of the through hole 16 to the second surface 12.

An electrically-conductive member 18 is formed inside each of the through holes 16, and thus blocks the through hole 16. The material of the electrically-conductive member 18 is not particularly limited providing the material is an electrically-conductive material, and an electrically-conductive material such as Cu, W, or Al can arbitrarily be selected therefor.

A sealed state in the first cavity 41 is arbitrarily be selected in accordance with the type of the functional element to be housed therein. In the case in which the first functional element 200 is, for example, a vibrating gyro sensor, the first cavity 41 is preferably in a reduced-pressure state (more preferably in a vacuum state). Thus, the vibratory phenomenon of the gyro sensor can be inhibited from being attenuated due to the air viscosity. Further, in the case in which the first functional element 200 is, for example, an acceleration sensor, the first cavity 41 is preferably in the atmospheric pressure state, and in an inert gas atmosphere (e.g., a nitrogen gas atmosphere). Thus, desired damping (viscosity) occurs between the inertial mass of the acceleration sensor and the atmospheric pressure to thereby obtain the acceleration sensor having predetermined detection sensitivity.

As shown in FIG. 1, the second base body 20 is a member provided with the second functional element 300. The second base body 20 is disposed so as to be opposed to the first base body 10 via the third base body 30 described later, and can be provided with substantially the same configuration as that of the first base body 10 except the point that the second functional element 300 is provided.

The second base body 20 has a first surface 21, as the surface to which the third base body 30 is bonded, and a second surface 22 on the opposite side to the first surface 21. The first surface 21 of the second base body 20 is a surface for supporting the second functional element 300, and at the same time is a surface constituting the second cavity 42. The first surface 21 of the second base body 20 is provided with second recessed sections 24, and the second functional element 300 is mounted below the second recessed sections 24. Due to the second recessed sections 24, the second functional element 300 can move only in a desired direction without being hindered by the second base body 20.

The material of the second base body 20 is not particularly limited, and for example, a glass substrate, a silicon substrate, and a quartz crystal substrate can be used as the second base body 20. From a viewpoint of workability and so on, glass can be used as the material of the second base body 20.

The second base body 20 is provided with a plurality of through holes 26 penetrating the first surface 21 and the second surface 22. In the example shown in the drawing, the through holes 26 penetrate the second base body 20 in the Z-axis direction. The inner wall surface of each of the through holes 26 can have a tapered shape as shown in the drawing. It should be noted that the planer shape (the shape viewed from the Z-axis direction) of the opening section of each of the through holes 26 is not particularly limited, but can have a circular shape or a rectangular shape (e.g., a square shape). Here, as shown in FIG. 1, the through holes 26 can be disposed so that the second functional element 300 and the opening section partially overlap each other. Further, although not shown in the drawing, the inner wall surface of each of the through holes 26 can be provided with an electrically-conductive layer extending from the inside of the through hole 26 to the second surface 22.

An electrically-conductive member 28 is formed inside each of the through holes 26, and thus blocks the through hole 26. The material of the electrically-conductive member 28 is not particularly limited providing the material is an electrically-conductive material, and an electrically-conductive material such as Cu, W, or Al can arbitrarily be selected therefor.

A sealed state in the second cavity 42 is arbitrarily be selected in accordance with the type of the functional element to be housed therein. In the case in which the second functional element 300 is, for example, a vibrating gyro sensor, the second cavity 42 is preferably in a reduced-pressure state (more preferably in a vacuum state). Thus, the vibratory phenomenon of the gyro sensor can be inhibited from being attenuated due to the air viscosity. Further, in the case in which the second functional element 300 is, for example, an acceleration sensor, the second cavity 42 is preferably in the atmospheric pressure state, and in an inert gas atmosphere (e.g., a nitrogen gas atmosphere). Thus, desired damping (viscosity) occurs between the inertial mass of the acceleration sensor and the atmospheric pressure to thereby obtain the acceleration sensor having predetermined detection sensitivity.

As shown in FIG. 1, the third base body 30 is sandwiched by the first base body 10 and the second base body 20, and is bonded to the first base body 10 and the second base body 20. Although not shown in the drawings, the third base body 30 can partially be bonded to the first and second functional elements 200, 300. As shown in the drawing, the third base body 30 has a first surface 31 to form a bonding surface to the first base body 10, and a second surface 32 to form a bonding surface to the second base body 20.

As shown in FIG. 1, the first surface 31 and the second surface 32 of the third base body 30 can also provided with a first recessed section 33 and a second recessed section 34, respectively. It is also possible to form the first cavity 41 for housing the first functional element 200 with the first recessed section 33 and the first surface 11 of the first base body 10. Therefore, the first recessed section 33 constitutes an inner wall of the first cavity 41. Further, it is also possible to form the second cavity 42 for housing the second functional element 300 with the second recessed section 34 and the first surface 21 of the second base body 20. Therefore, the second recessed section 34 constitutes an inner wall of the second cavity 42.

The material of the third base body 30 is not particularly limited, and for example, a glass substrate, a silicon substrate, and a quartz crystal substrate can be used as the third base body 30. Silicon can preferably be used as the material of the third base body 30.

The method of bonding the third base body 30 to each of the first base body 10 and the second base body 20 is not particularly limited, but can be, for example, anodic bonding, bonding with low-melting-point glass (glass paste), or bonding with solder. Alternatively, it is also possible to perform bonding by providing a metal thin film (not shown) to each of the bonding portions of the first base body 10, the second base body 20, and the third base body 30, and then performing eutectic bonding between the metal thin films. In the case in which, for example, the first base body 10 and the second base body 20 are made of glass, and the third base body 30 is made of silicon, a bonding method using anodic bonding can be adopted. On the other hand, in the case in which the first base body 10 and the second base body 20, and the third base body 30 are made of glass, a bonding method using glass bonding can be adopted.

The planar shape (the shape viewed from the Z-axis direction) of the package 40 composed of the first base body 10, the second base body 20, and the third base body 30 is not particularly limited providing the package 40 is capable of housing the first and second functional elements 200, 300, and can be, for example, a rectangular shape (more specifically, an oblong shape).

Further, as shown in the drawings, an outer surface 43 of the package 40 can also be provided with electrically-conductive layers 51, 52 to form external terminal pads and wiring patterns if necessary. The electrically-conductive layer 51 is disposed so as to be connected to the electrically-conductive member 18 provided to each of the through holes 16. Further, the electrically-conductive layer 52 is disposed so as to be connected to the electrically-conductive member 28 provided to each of the through holes 26. Further, although not shown in the drawings, in the case in which the electrically-conductive layers 51, 52 are not formed, direct wire bonding connection can also be adopted using the electrically-conductive members 18, 28 as the external terminals.

Further, in the case in which the material of the first and second base bodies 10, 20 is glass, and the material of the third base body 30 is silicon or glass, in the electronic device using the glass and the silicon having the respective thermal expansion coefficients different from each other, it is possible to hold the third base body 30 made of silicon with the first base body 10 and the second base body 20 made of glass on both sides of the third base body 30. Thus, the stress caused by the difference in thermal expansion coefficient is cancelled (offset) in a heating process in the manufacturing process, and therefore, it is possible to provide an electronic device having improved reliability.

Configuration of Functional Elements

The first and second functional elements 200, 300 are mounted (housed) in the first cavity 41 and the second cavity 42, respectively. The first and second functional elements 200, 300 housed in the package 40 can be bonded to the first base body 10 and the second base body 20, respectively, by, for example, anodic bonding or direct bonding, or can be bonded with an adhesive.

The configuration of the first and second functional elements 200, 300 is not particularly limited providing the functional elements detect physical quantities and act in the cavities sealed in a reduced-pressure state or in an inert gas atmosphere, and a variety of types of functional elements such as a gyro sensor, an acceleration sensor, a vibrator, a surface acoustic wave (SAW) element, or a micro-actuator can be cited.

The material of the first and second functional elements 200, 300 is, for example, silicon provided with electrical conductivity by doping impurities such as phosphorus or boron.

Figure 2:
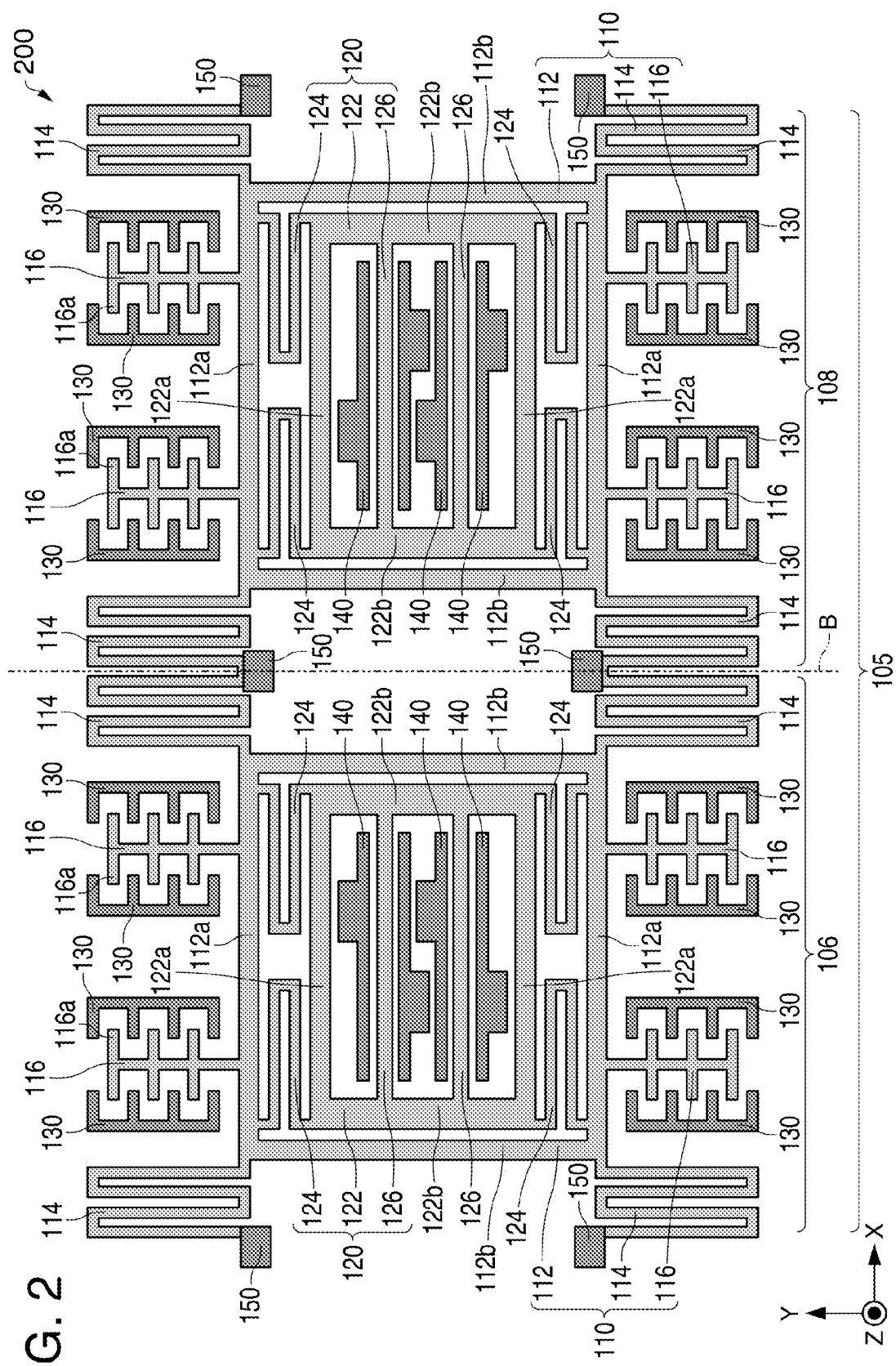
FIG. 2 is a plan view schematically showing an example of a first functional element provided to the electronic device according to the first embodiment.

Hereinafter, as an example of the electronic device 100 according to the first embodiment, a configuration adopting a gyro sensor as the first functional element 200, and adopting an acceleration sensor (capacitance type MEMS acceleration sensor element) as the second functional element 300 will be explained. FIG. 2 is a plan view schematically showing the first functional element 200 mounted on the electronic device 100 according to the first embodiment. Further, FIG. 7 is a plan view schematically showing the second functional element 300 mounted on the electronic device 100 according to the first embodiment. However, the configuration of the first and second functional elements 200, 300 is not limited to the configuration described below, configurations of known functional elements can also be adopted. It should be noted that in FIG. 2, the X axis, the Y axis, and the Z axis are shown as the three axes perpendicular to each other for the sake of convenience. The same applies to FIGS. 3 through 7 described later.

Configuration of Gyro Sensor

As shown in FIG. 2, the first functional element 200 can be provided with a vibration system structure 105, driving stationary electrodes 130, detecting stationary electrodes 140, and fixation sections 150.

The vibration system structure 105 is integrally formed by processing, for example, a silicon substrate bonded to the first base body 10 (or the second base body 20). Thus, it becomes possible to apply a fine processing technology used in the production of silicon semiconductor devices, and miniaturization of the vibration system structure 105 can be achieved.

The vibration system structure 105 is supported by the fixation sections 150 fixed to the first base body 10, and is disposed separately from the first base body 10. The vibration system structure 105 can be provided with a first vibrating body 106 and a second vibrating body 108. The first vibrating body 106 and the second vibrating body 108 are connected to each other along the X axis.

The first vibrating body 106 and the second vibrating body 108 can have shapes symmetric about a boundary line B (a line disposed along the Y axis) between the first vibrating body 106 and the second vibrating body 108. Therefore, the configuration of the first vibrating body 106 will hereinafter be explained, and the explanation of the second vibrating body 108 will be omitted.

The first vibration body 106 has a drive section 110 and a detection section 120. The drive section 110 can be provided with a driving support section 112, driving spring sections 114, and driving movable electrodes 116.

The driving support section 112 has, for example, a frame-like shape, and the detection section 120 is disposed inside the driving support section 112. In the example shown in the drawing, the driving support section 112 is composed of first extending sections 112a extending along the X axis and second extending sections 112b extending along the Y axis.

The driving spring sections 114 are disposed outside the driving support section 112. In the example shown in the drawing, one end of each of the driving spring sections 114 is connected to the vicinity of one of corners (connecting portions of the first extending sections 112a and the second extending sections 112b) of the driving support section 112. The other ends of the driving spring sections 114 are connected respectively to the fixation sections 150.

In the example shown in the drawing, the number of the driving spring sections 114 provided to the first vibrating body 106 is four. Therefore, the first vibrating body 106 is supported by the four fixation sections 150. It should be noted that the fixation sections 150 disposed on the boundary line B between the first vibrating body 106 and the second vibrating body 108 are not required to be disposed.

The driving spring sections 114 each have a shape extending along the X axis while reciprocating along the Y axis. The plurality of driving spring sections 114 is disposed so as to be symmetric about an imaginary line (not shown) passing through the center of the driving support section 112 along the X axis and an imaginary line (not shown) passing through the center of the driving support section 112 along the Y axis. By forming the driving spring sections 114 to have the shapes described above, it is possible to smoothly extend and contract the driving spring sections 114 in the X-axis direction, namely the vibrating direction of the drive section 110, while inhibiting the driving spring sections 114 from deforming in the Y-axis direction and the Z-axis direction. Further, it is possible to vibrate the driving support section 112 (the drive section 110) along the X axis due to the extension and the contraction of the driving spring sections 114. It should be noted that the number of the driving spring sections 114 is not particularly limited providing the driving support section 112 can be vibrated along the X axis.

The driving movable electrodes 116 are disposed outside the driving support section 112 so as to be connected to the driving support section 112. More specifically, the driving movable electrodes 116 are connected to the first extending sections 112a of the driving support section 112.

The driving stationary electrodes 130 are disposed outside the driving support section 112. The driving stationary electrodes 130 are fixed on the first base body 10. In the example shown in the drawing, the number of the driving stationary electrodes 130 disposed is plural, and the driving stationary electrodes 130 are disposed so as to be opposed to each other via the driving movable electrode 116. In the example shown in the drawing, the driving stationary electrodes 130 each have a comb-like shape, and the driving movable electrode 116 has projecting portions 116a, which can be inserted between comb teeth of the driving stationary electrodes 130. By decreasing the distance (gap) between the driving stationary electrode 130 and the projecting portion 116a, the electrostatic force acting between the driving stationary electrodes 130 and the driving movable electrode 116 can be increased.

When applying a voltage between the driving stationary electrodes 130 and the driving movable electrode 116, it is possible to generate the electrostatic force between the driving stationary electrodes 130 and the driving movable electrode 116. Thus, the driving support section 112 (the drive section 110) can be vibrated along the X axis while extending and contracting the driving spring sections 114 along the X axis. On this occasion, by setting the vibration system structure 105 in a reduced-pressure atmosphere, in particular at 10 Pa or lower, the efficiency of the vibration rises.

It should be noted that although the number of the driving movable electrodes 116 disposed in the first vibrating body 106 is four in the example shown in the drawing, the number is not particularly limited providing the driving support section 116 can be vibrated along the X axis. Further, although in the example shown in the drawing, the driving stationary electrodes 130 are disposed so as to be opposed to each other via the driving movable electrode 116, it is also possible to dispose the driving stationary electrode 130 only on one side of the driving movable electrode 116 providing the driving support section 112 can be vibrated along the X axis.

The detection section 120 is connected to the drive section 110. In the example shown in the drawing, the detection section 120 is disposed inside the driving support section 112. The detection section 120 can be provided with a detecting support section 122, detecting spring sections 124, and detecting movable electrodes 126. It should be noted that although not shown in the drawings, the detection section 120 can be disposed outside the driving support section 112 providing the detection section 120 is connected to the drive section 110.

The detecting support section 122 has, for example, a frame-like shape. In the example shown in the drawing, the detecting support section 122 is composed of third extending sections 122a extending along the X axis and fourth extending sections 122b extending along the Y axis.

The detecting spring sections 124 are disposed outside the detecting support section 122. The detecting spring sections 124 connect the detecting support section 122 and the driving support section 112. More specifically, one end of each of the detecting spring sections 124 is connected to the vicinity of one of corners (connecting portions of the third extending sections 122a and the fourth extending sections 122b) of the detecting support section 122. The other ends of the detecting spring sections 124 are connected to the first extending sections 112a of the driving support section 112.

The detecting spring sections 124 each have a shape extending along the Y axis while reciprocating along the X axis. In the example shown in the drawing, the number of the detecting spring sections 124 provided to the first vibrating body 106 is four. The plurality of detecting spring sections 124 is disposed so as to be symmetric about an imaginary line (not shown) passing through the center of the detecting support section 122 along the X axis and an imaginary line (not shown) passing through the center of the detecting support section 122 along the Y axis. By forming the detecting spring sections 124 to have the shapes described above, it is possible to smoothly extend and contract the detecting spring sections 124 in the Y-axis direction, namely the vibrating direction of the detection section 120, while inhibiting the detecting spring sections 124 from deforming in the X-axis direction and the Z-axis direction. Further, it is possible to displace the detecting support section 122 (the detection section 120) along the Y axis due to the extension and the contraction of the detecting spring sections 124. It should be noted that the number of the detecting spring sections 124 is not particularly limited providing the detecting support section 122 can be displaced along the Y axis.

The detecting movable electrodes 126 are disposed inside the detecting support section 122 so as to be connected to the detecting support section 122. In the example shown in the drawing, the detecting movable electrodes 126 each extend along the X axis, and are connected to the two fourth extending sections 122b of the detecting support section 122.

The detecting stationary electrodes 140 are disposed inside the detecting support section 122. The detecting stationary electrodes 140 are fixed on the first base body 10.

In the example shown in the drawing, the number of the detecting stationary electrodes 140 disposed is plural, and the detecting stationary electrodes 140 are disposed so as to be opposed to each other via the detecting movable electrode 126.

The number and the shapes of the detecting movable electrodes 126 and the detecting stationary electrodes 140 are not particularly limited providing the variation of the capacitance between the detecting movable electrodes 126 and the detecting stationary electrodes 140 can be detected.

Then, the operation of the first functional element 200 will be explained. FIG. 3 through 6 are diagrams for explaining the operation of the first functional element 200 of the electronic device 100 according to the first embodiment. It should be noted that in FIG. 3 through 6, the sections of the first functional element 200 are described in a simplified manner for the sake of convenience.

Figure 3:
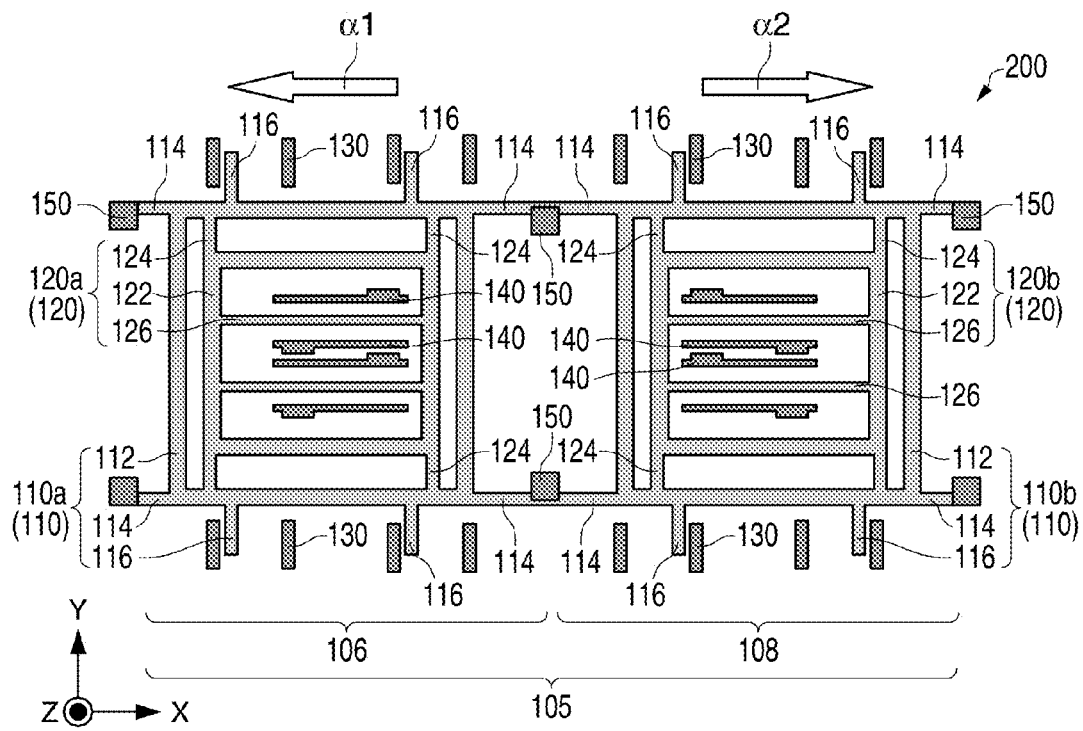
FIG. 3 is a plan view for explaining an operation of the first functional element provided to the electronic device according to the first embodiment.
Figure 4:
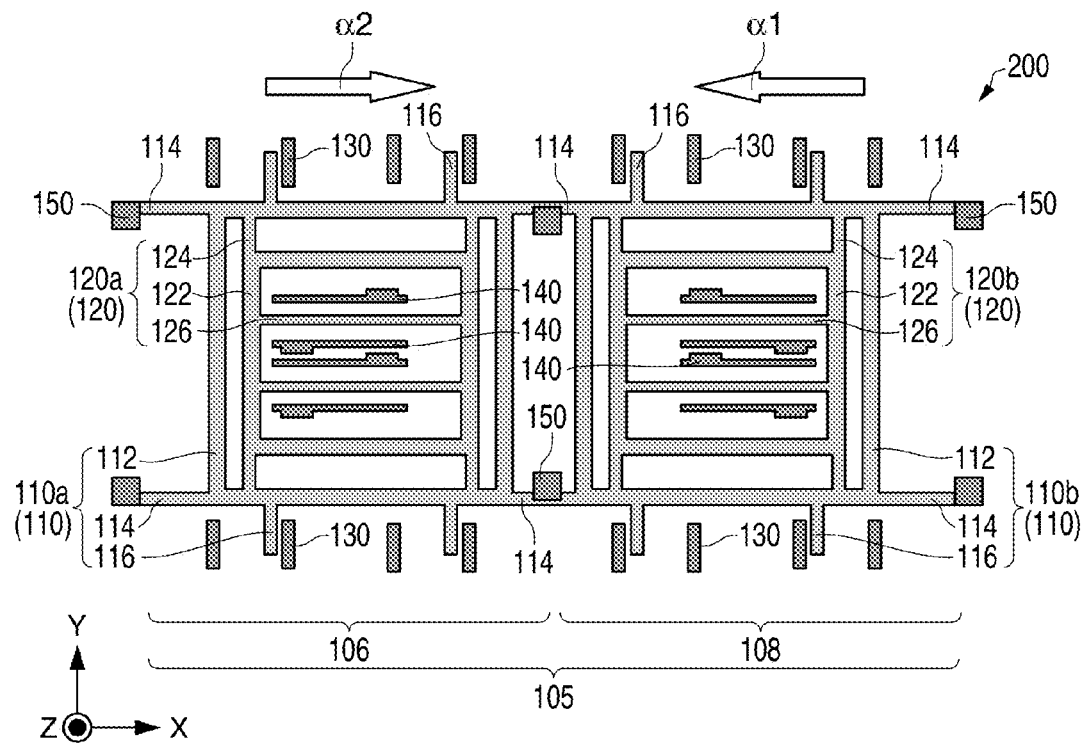
FIG. 4 is a plan view for explaining the operation of the first functional element provided to the electronic device according to the first embodiment.

When applying a voltage between the driving stationary electrodes 130 and the driving movable electrode 116 using a power supply not shown, it is possible to generate the electrostatic force between the driving stationary electrodes 130 and the driving movable electrode 116. Thus, the driving spring sections 114 can be extended and contracted along the X axis, and thus the drive section 110 can be vibrated along the X axis as shown in FIGS. 3 and 4.

More specifically, a first alternating voltage is applied between the driving movable electrode 116 and the driving stationary electrodes 130 of the first vibrating body 106, and a second alternating voltage having a phase 180 degrees shifted from that of the first alternating voltage is applied between the driving movable electrode 116 and the driving stationary electrodes 130 of the second vibrating body 108. Thus, it is possible to vibrate a first drive section 110a (the drive section 110 of the first vibrating body 106) and a second drive section 110b (the drive section 110 of the second vibrating body 108) at a predetermined frequency with respective phases opposite to each other along the X axis. In other words, the first drive section 110a and the second drive section 110b connected to each other along the X axis vibrate along the X axis with the respective phases opposite to each other. In the example shown in FIG. 3, the first drive section 110a is displaced in an α1 direction, and the second drive section 110b is displaced in an α2 direction opposite to the α1 direction. In the example shown in FIG. 4, the first drive section 110a is displaced in the α2 direction, and the second drive section 110b is displaced in the α1 direction.

It should be noted that since the detection section 120 is connected to the drive section 110, the detection section 120 also vibrates along the X axis due to the vibration of the drive section 110. In other words, the first vibrating body 106 and the second vibrating body 108 are displaced along the X axis in respective directions opposite to each other.

Figure 5:
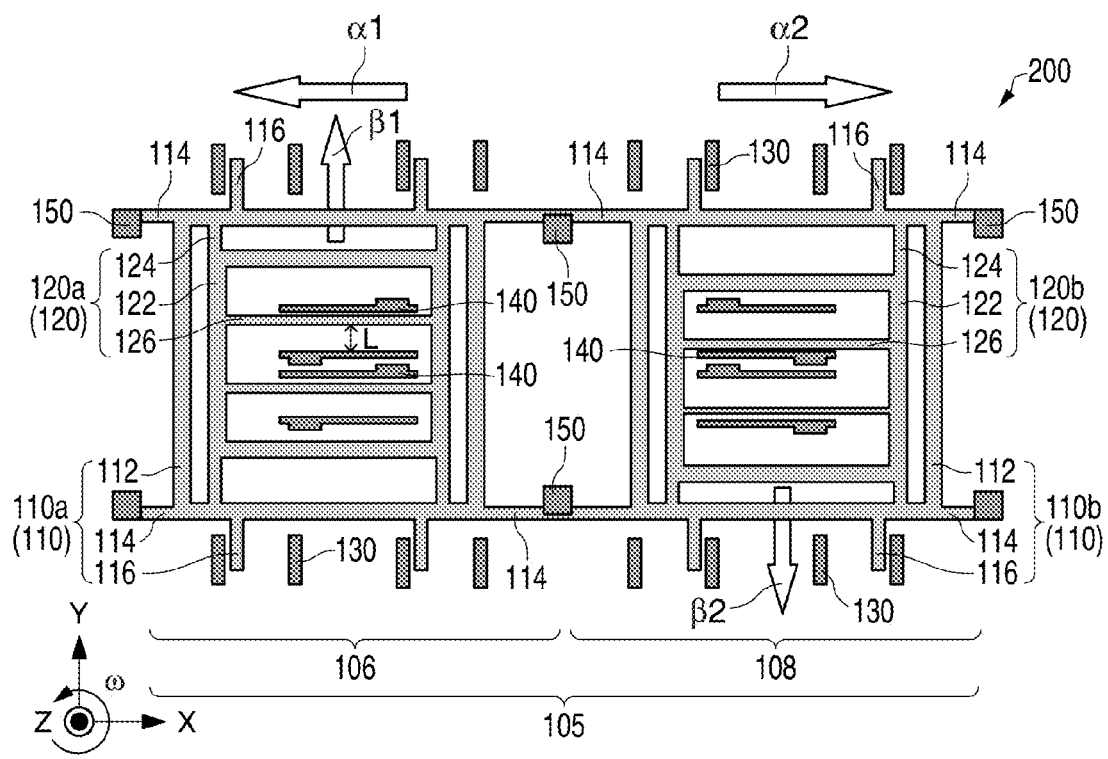
FIG. 5 is a plan view for explaining the operation of the first functional element provided to the electronic device according to the first embodiment.
Figure 6:
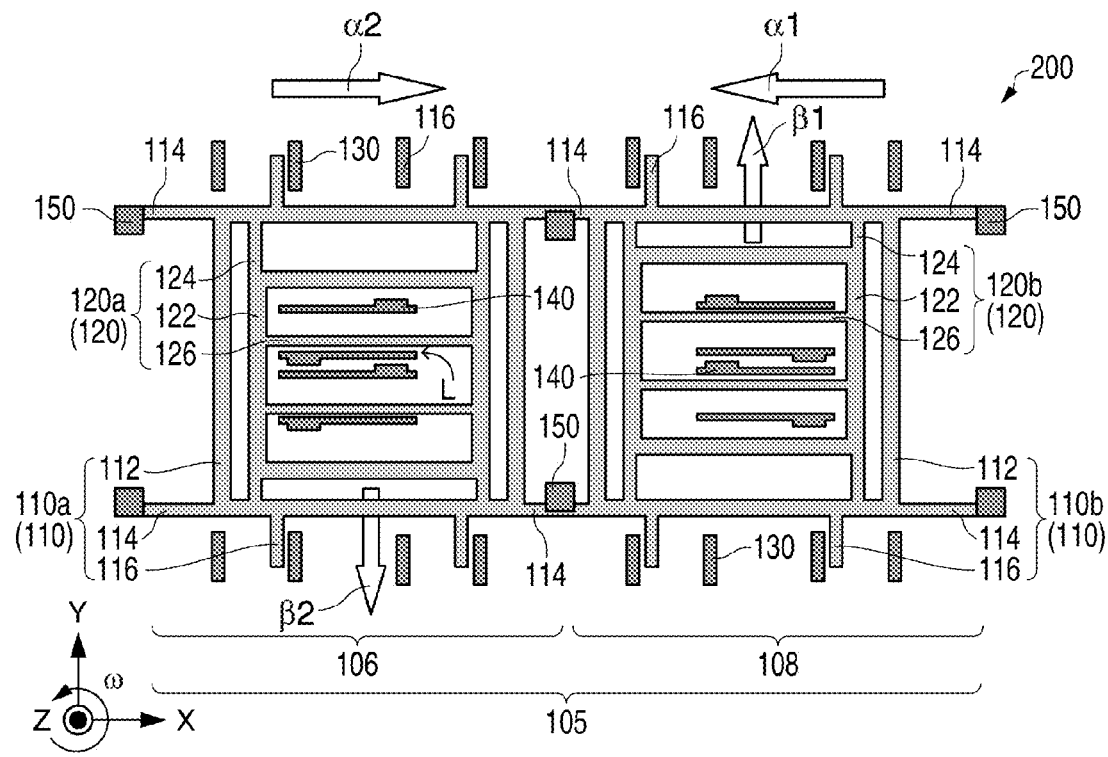
FIG. 6 is a plan view for explaining the operation of the first functional element provided to the electronic device according to the first embodiment.
Figure 7:
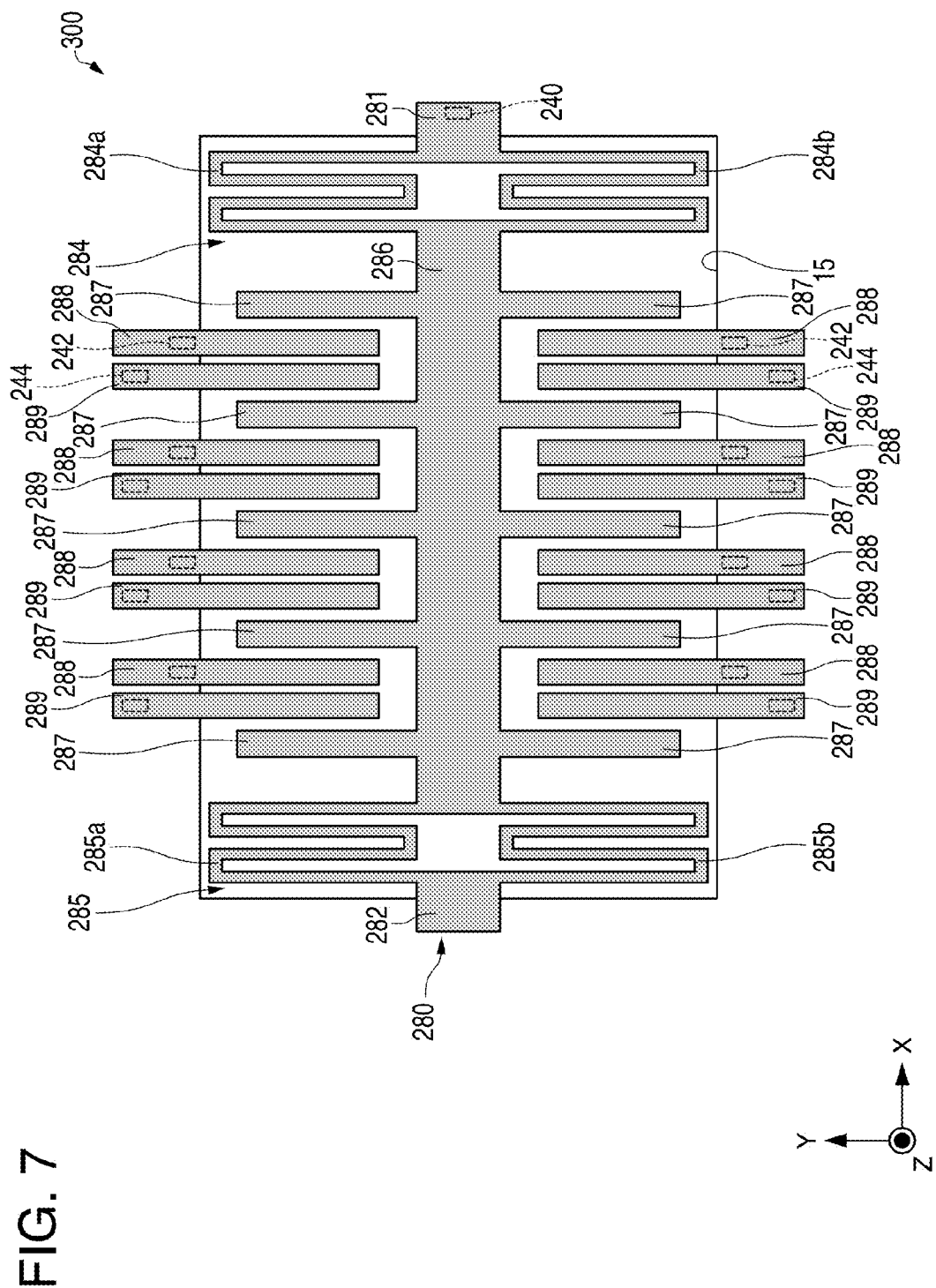
FIG. 7 is a plan view schematically showing an example of a second functional element provided to the electronic device according to the first embodiment.

As shown in FIGS. 5 and 6, when an angular velocity ω around the Z axis is applied to the functional element 200 in the state in which the drive sections 110a, 110b perform a first vibration, a Coriolis force acts on the detection section 120 and the detection section 120 is displaced along the Y axis. Specifically, a first detection section 120a (the detection section 120 connected to the first drive section 110a) and a second detection section 120b (the detection section 120 connected to the second drive section 110b) are displaced along the Y axis in respective directions opposite to each other due to the first vibration and the Coriolis force. In the example shown in FIG. 5, the first detection section 120a is displaced in a β1 direction, and the second detection section 120b is displaced in a β2 direction opposite to the β1 direction. In the example shown in FIG. 6, the first detection section 120a is displaced in the β2 direction, and the second detection section 120b is displaced in the β1 direction.

By the detection sections 120a, 120b being displaced along the Y axis, the distance L between the detecting movable electrode 126 and the detecting stationary electrode 140 varies. Therefore, the capacitance between the detecting movable electrode 126 and the detecting stationary electrode 140 varies. In the first functional element 200, by applying a voltage to the detecting movable electrode 126 and the detecting stationary electrode 140, the variation of the capacitance between the detecting movable electrode 126 and the detecting stationary electrode 140 is detected, and thus, the angular velocity ω around the Z axis can be obtained.

It should be noted that although the configuration (the electrostatic driving method) of driving the drive section 110 using the electrostatic force is explained above, the method of driving the drive section 110 is not particularly limited, but a piezoelectric driving method, an electromagnetic driving method using a Lorentz force of a magnetic field, and so on can be applied. It should be noted that in the configuration of the gyro sensor, by setting the atmosphere to a reduced-pressure atmosphere, preferable vibration characteristics and detection characteristics can be obtained.

Configuration of Acceleration Sensor

As shown in FIG. 7, the second functional element 300 can include fixation sections 281, 282, connection sections 284, 285, a movable section 286, movable electrode sections 287, and stationary electrode sections 288, 289.

The movable section 286 is displaced in the X-axis direction (the +X direction or the −X direction) in accordance with the variation of the acceleration in the X-axis direction while elastically deforming the connection sections 284, 285. Due to such a displacement, the gap between the movable electrode section 287 and the stationary electrode section 288 and the gap between the movable electrode section 287 and the stationary electrode section 289 vary in size. Therefore, due to such a displacement, the capacitance between the movable electrode section 287 and the stationary electrode section 288 and the capacitance between the movable electrode section 287 and the stationary electrode section 289 vary in amount. Based on the variation of these capacitance amounts, the second functional element 300 can detect the acceleration in the X-axis direction.

The fixation sections 281, 282 are bonded to the first surface 21 of the second base body 20. In the example shown in the drawing, the fixation sections 281, 282 are disposed so as to straddle the outer peripheral edge 15 of the first recessed section 24 in a plan view.

The movable section 286 is disposed between the fixation section 281 and the fixation section 282. In the example shown in FIG. 7, the planner shape of the movable section 286 is an oblong shape having a long side along the X axis.

The connection sections 284, 285 connect the movable section 286 to the fixation sections 281, 282, respectively. The connection sections 284, 285 are each configured so as to be provided with a desired spring constant, and capable of displacing the movable section 286 in the X-axis direction. In the example shown in FIG. 7, the connection section 284 is composed of two beams 284a, 284b each having a shape extending in the X-axis direction while meandering in the Y-axis direction. Similarly, the connection section 285 is composed of two beams 285a, 285b each having a shape extending in the X-axis direction while meandering in the Y-axis direction.

The movable electrode sections 287 are connected to the movable section 286. The number of the movable electrode sections 287 disposed is plural. The movable electrode sections 287 project from the movable section 286 in the +Y direction and the −Y direction, and are arranged in the X-axis direction so as to form a comb-like shape.

The stationary electrode sections 288, 289 each have one end portion bonded to the first surface 11 of the first base body 10 as a fixed end, and the other end portion extending toward the movable section 286 as a free end. Each of the number of the stationary electrode sections 288 and the number of the stationary electrode sections 289 is plural. The stationary electrode sections 288 are electrically connected to a wiring line not shown, and the stationary electrode sections 289 are electrically connected to a wiring line not shown. The stationary electrode sections 288, 289 are arranged alternately in the X-axis direction so as to form a comb-like shape. The stationary electrode sections 288, 289 are each disposed so as to be opposed to the movable electrode section 287 with a distance, wherein the stationary electrode section 288 is disposed on one side (the −X direction side) of the movable electrode section 287, and the stationary electrode section 289 is disposed on the other side (the +X direction side) thereof.

The fixation sections 281, 282, the connection sections 284, 285, the movable section 286, and the movable electrode sections 287 are formed integrally.

The fixation section 281 has a contact section 240 to be connected to a wiring line not shown. Thus, the fixation section 281 is electrically connected to an external connection terminal. Further, the stationary electrode sections 288 each have a contact section 242 to be connected to a wiring line not shown. Thus, the stationary electrode sections 288 are electrically connected to an external connection terminal. Further, the stationary electrode sections 289 each have a contact section 244 to be connected to a wiring line not shown. Thus, the stationary electrode sections 289 are electrically connected to an external connection terminal.

In the second functional element 300, the capacitance between the movable electrode sections 287 and the stationary electrode sections 288 can be measured using the external connection terminals electrically connected thereto. Further, in the second functional element 300, the capacitance between the movable electrode sections 287 and the stationary electrode sections 289 can be measured using the external connection terminals electrically connected thereto. As described above, in the second functional element 300, it is possible to separately measure the capacitance between the movable electrode sections 287 and the stationary electrode sections 288 and the capacitance between the movable electrode sections 287 and the stationary electrode sections 289, and to accurately detect the physical quantity (the acceleration) based on the measurement results. It should be noted that in the configuration of the acceleration sensor, by setting the atmosphere to the atmospheric pressure to thereby make use of the air viscosity, preferable detection characteristics can be obtained.

According to the configuration described above, the electronic device 100 according to the present embodiment can be constituted.

The electronic device 100 according to the present embodiment has, for example, the following features.

According to the electronic device 100 related to the present embodiment, since the electronic device having the first functional element 200 and the second functional element 300 stacked on each other can be provided, it is possible to provide an electronic device making a greater contribution to miniaturization and space saving of the device compared to the case of forming the first functional element 200 and the second functional element 300 on the same substrate.

Further, according to the electronic device 100 related to the present embodiment, since the electronic device having the first functional element 200 and the second functional element 300 stacked on each other can be provided, the detection axes of the functional elements can easily be arranged with high alignment accuracy in the manufacturing process. Therefore, it is possible to provide an electronic device simplifying the manufacturing process and having the detection axes with high alignment accuracy.

Further, according to the electronic device 100 related to the present embodiment, since a cavity sealed in a desired pressure atmosphere can be formed by performing the stacking process in the desired pressure atmosphere, the cavity sealing can be performed with an easier method. Therefore, an electronic device capable of simplifying the manufacturing process can be provided.

Further, according to the electronic device 100 related to the present embodiment, since the first functional element 200 and the second functional element 300 are not formed on the same substrate, it is possible to provide an electronic device capable of preventing the reliability of the functional elements mounted therein from degrading.

For example, in the case in which the gyro sensor is included in at least one of the first functional element 200 and the second functional element 300, it is necessary to drive the gyro sensor to vibrate for the requirement of the manufacturing process. In the case in which the first functional element 200 and the second functional element 300 are formed on the same substrate, there is a possibility that the vibration propagates to the other functional element to degrade the reliability of the functional element. In contrast, according to the electronic device 100, since the first base body 10 and the second base body 20 are respectively provided with the functional elements, it is possible to prevent the reliability of the elements from degrading due to the vibration and so on.

Further, according to the electronic device 100 related to the present embodiment, since the first functional element 200 and the second functional element 300 are not formed on the same substrate, an electronic device with the influence on the yield ratio reduced can be provided.

For example, in the case in which only either one of the first functional element 200 and the second functional element 300 is defective, since the first functional element 200 and the second functional element 300 are formed on the same substrate, the yield ratio is dramatically degraded, and thus the structure of the electronic device significantly affects the yield ratio. In contrast, according to the electronic device 100, the functional elements are respectively provided to the first base body 10 and the second base body 20. Therefore, even in the case in which a failure occurs in one of the functional elements, it is not required to treat the other of the functional elements as a defective, and therefore, the influence on the yield ratio can be reduced.

First Modified Example

Figure 8:
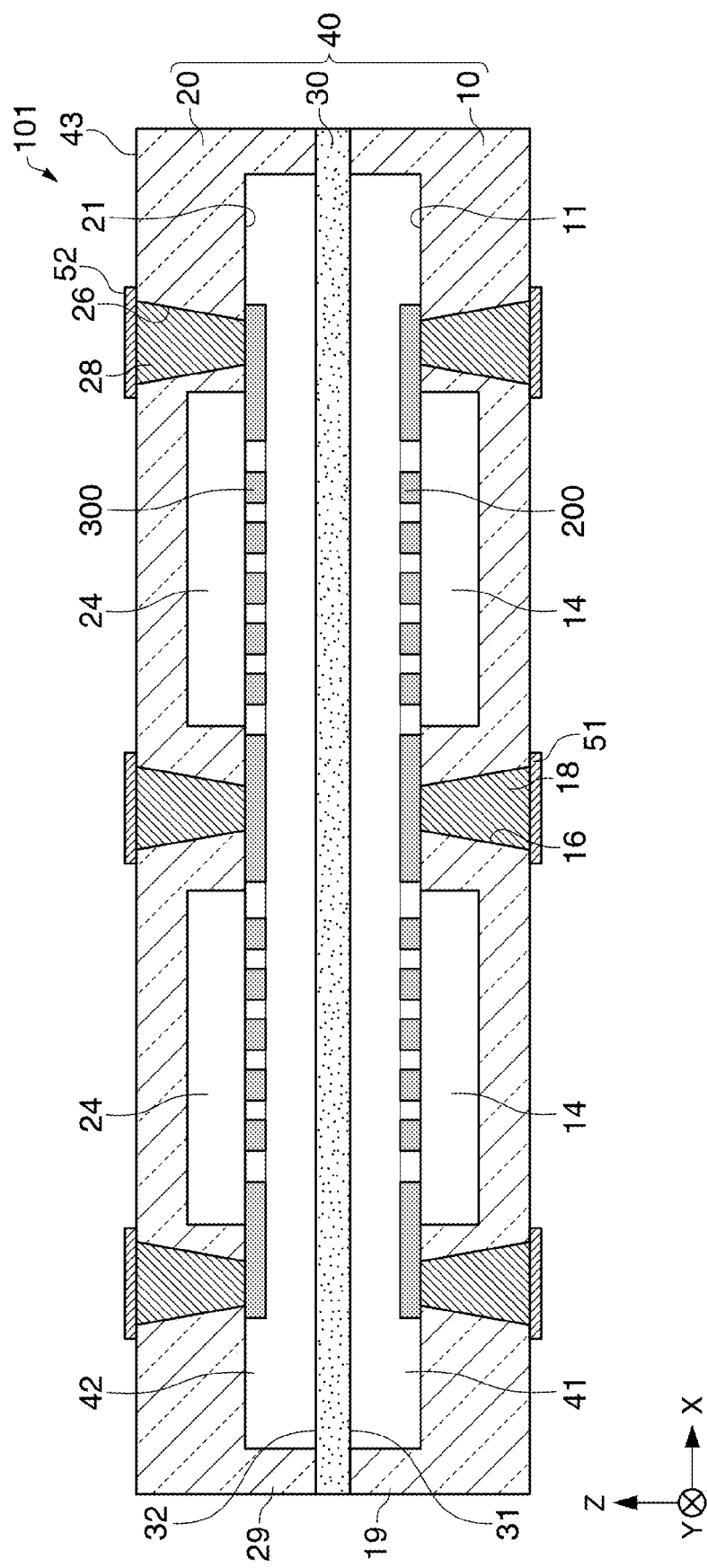
FIG. 8 is a cross-sectional view schematically showing a first modified example of the electronic device according to the first embodiment.

Then, a first modified example of the first embodiment will be explained with reference to FIG. 8. FIG. 8 is a cross-sectional view schematically showing an electronic device 101 according to the first modified example. The electronic device 101 according to the first modified example is different from the electronic device 100 according to the first embodiment in the shapes of the first base body 10, the second base body 20, and the third base body 30. In the following description, only the points in which the electronic device 101 is different from the electronic device 100 according to the first embodiment will be explained. The members having already been explained will be denoted with the same reference symbols, and the detailed explanation thereof will be omitted.

As shown in the drawing, in the electronic device 101 according to the first modified example, the third base body 30 is not provided with the first recessed section 33 and the second recessed section 34, but is a plate-like member.

In contrast, on the peripheral edge of the first surface 11 of the first base body 10, there is formed a frame body 19 as a spacer for forming the first cavity 41. Therefore, the first cavity 41 for housing the first functional element 200 is formed of the first surface 11 and the frame body 19 of the first base body 10, and the first surface 31 of the third base body 30.

Further, on the peripheral edge of the first surface 21 of the second base body 20, there is formed a frame body 29 as a spacer for forming the second cavity 42. Therefore, the second cavity 42 for housing the second functional element 300 is formed of the first surface 21 and the frame body 29 of the second base body 20, and the second surface 32 of the third base body 30.

The electronic device 101 according to the first modified example can be provided with the features described above similarly to the electronic device 100 according to the first embodiment.

Second Modified Example

Figure 9:
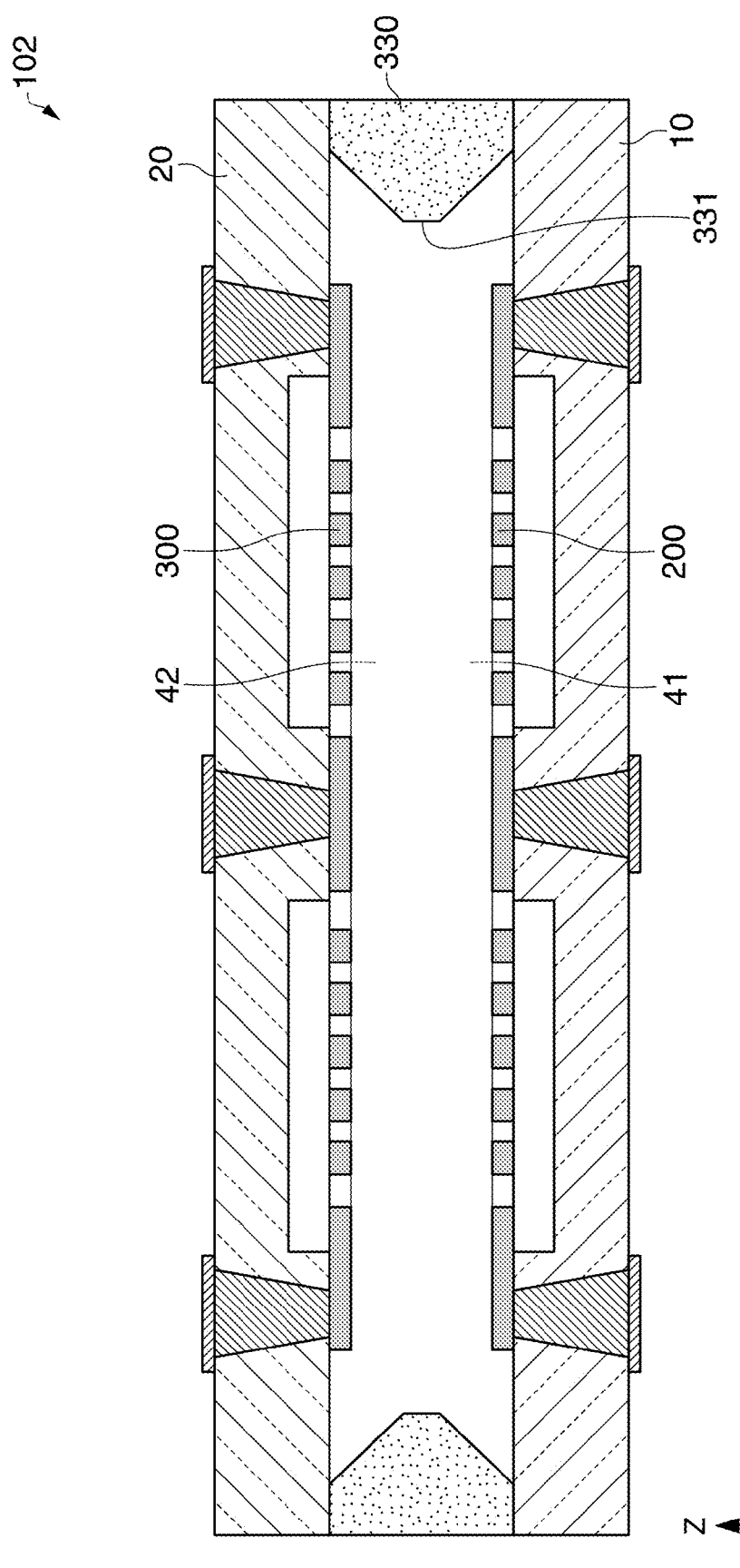
FIG. 9 is a cross-sectional view schematically showing a second modified example of the electronic device according to the first embodiment.

Then, a second modified example of the first embodiment will be explained with reference to FIG. 9. FIG. 9 is a cross-sectional view schematically showing an electronic device 102 according to the second modified example. The electronic device 102 according to the second modified example is different from the electronic device 100 according to the first embodiment in the shape of a third base body 330. In the following description, only the points in which the electronic device 102 is different from the electronic device 100 according to the first embodiment will be explained. The members having already been explained will be denoted with the same reference symbols, and the detailed explanation thereof will be omitted.

As shown in the drawing, in the electronic device 102 according to the second modified example, the third base body 330 is not provided with the first recessed section 33 and the second recessed section 34, but is provided with an opening section 331 for communicating the first cavity 41 and the second cavity 42 with each other. In other words, the third base body 330 is a frame body having the opening section 331.

In the electronic device 102, the first functional element 200 and the second functional element 300 are the functional elements for detecting the same physical quantity. It should be noted that the detection axis direction can be different between the first functional element 200 and the second functional element 300.

The electronic device 102 according to the second modified example can be provided with the features described above similarly to the electronic device 100 according to the first embodiment.

Third Modified Example

Figure 10:
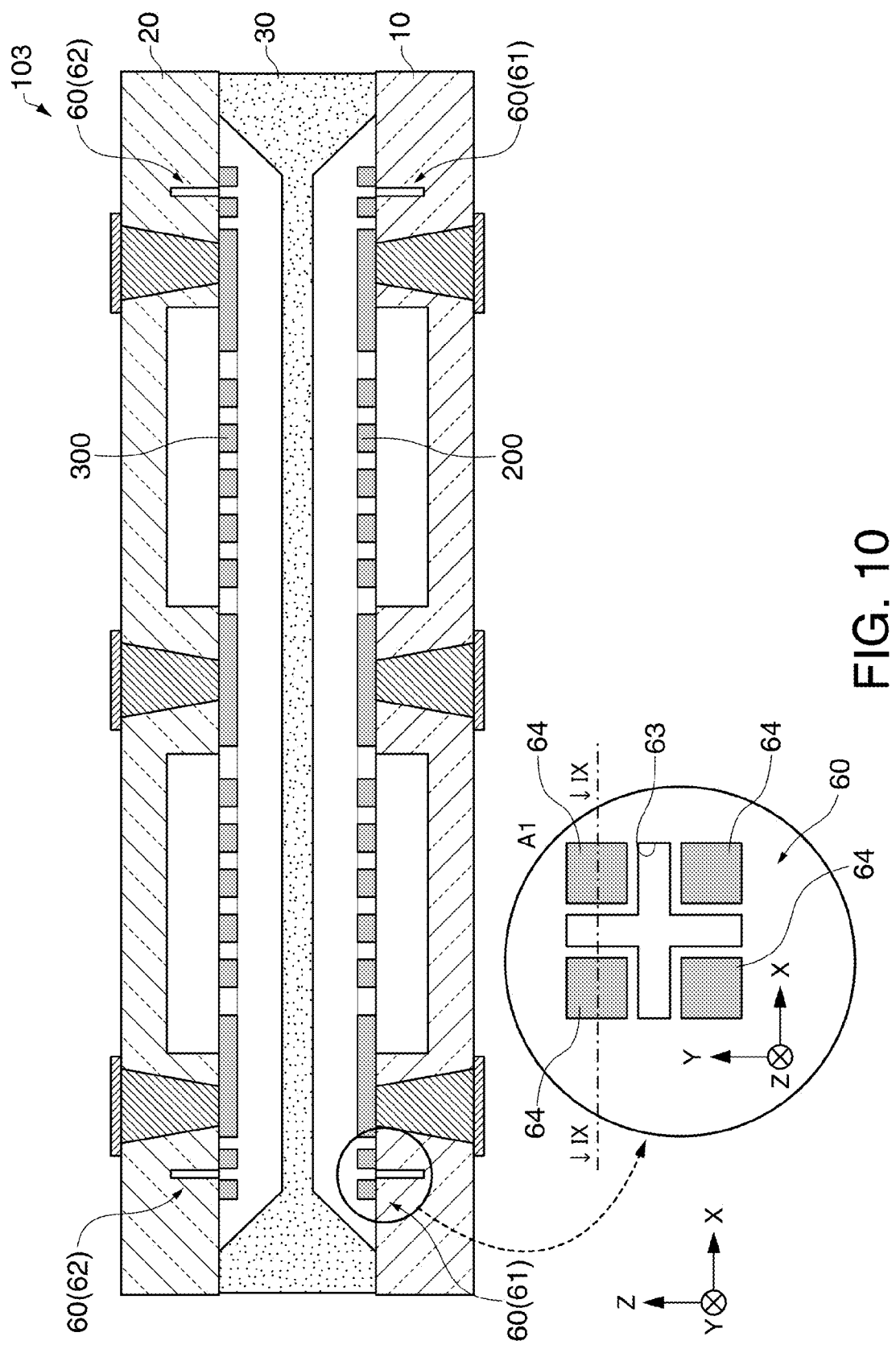
FIG. 10 is a cross-sectional view schematically showing a third modified example of the electronic device according to the first embodiment.

Then, a third modified example of the first embodiment will be explained with reference to FIG. 10. FIG. 10 is a cross-sectional view schematically showing an electronic device 103 according to the third modified example. The electronic device 103 according to the third modified example is different from the electronic device 100 according to the first embodiment in the point that alignment marks 60 are provided to the first surface 11 of the first base body 10 and the first surface 21 of the second base body 20. In the following description, only the points in which the electronic device 103 is different from the electronic device 100 according to the first embodiment will be explained. The members having already been explained will be denoted with the same reference symbols, and the detailed explanation thereof will be omitted.

The first surface 11 of the first base body 10 is provided with first alignment marks 61. Further, the first surface 21 of the second base body 20 is provided with second alignment marks 62. The first alignment marks 61 and the second alignment marks 62 are arranged so that the first functional element 200 and the second functional element 300 are in a predetermined arrangement and each can be provided with a desired detection axis direction in the case in which each of the first alignment marks 61 and the corresponding one of the second alignment marks 62 coincide with each other in the stacking direction (the Z-axis direction in the example shown in the drawing). Each of the number of the first alignment marks 61 formed and the number of the second alignment marks 62 formed can be plural.

The alignment marks 60 (the first alignment marks 61 and the second alignment marks 62) are not particularly limited providing the alignment marks 60 can visually be detected, and used for alignment in the process of stacking the first base body 10, the second base body 20, and the third base body 30 on each other. An example of the alignment marks 60 will hereinafter be explained.

FIG. 10 includes an enlarged plan view A1 of one of the alignment marks 60, and shows a planner shape of the alignment mark 60 viewed from the Z-axis direction. The alignment marks shown in FIG. 10 each correspond to a cross-sectional view along the IX-IX line in the enlarged plan view A1. As shown in the enlarged plan view A1, the alignment mark 60 can be formed of a groove section 63 provided to the first base body 10 (or the second base body 20), and structures 64 arranged on the periphery of the groove section 63. The groove section 63 can have, for example, a crisscross shape (a cross shape) in the plan view. Further, as shown in the drawing, it is also possible to arrange the four structures 64 along the opening sections of the crisscross shape (the cross shape) of the groove section 63 so as to sandwich the opening sections.

The electronic device 103 according to the third modified example can be provided with the features described above similarly to the electronic device 100 according to the first embodiment, and further provided with the following feature.

According to the electronic device 103, since the alignment can reliably be performed in the process of stacking the first base body 10, the second base body 20, and the third base body 30 on each other, it is possible for the functional elements to have the detection axes aligned with higher alignment accuracy. Therefore, an electronic device with further improved reliability can be provided.

Fourth Modified Example

Figure 11:
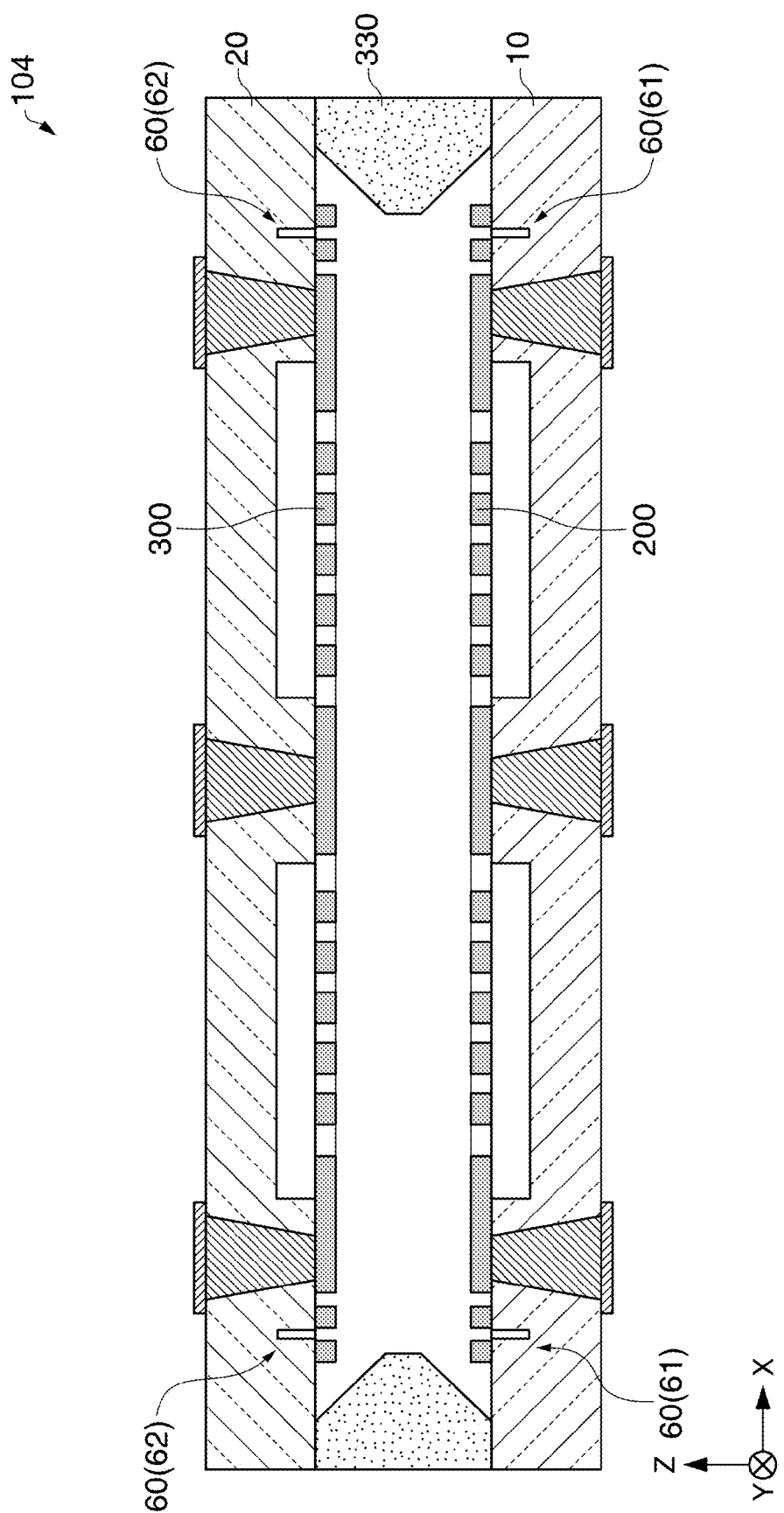
FIG. 11 is a cross-sectional view schematically showing a fourth modified example of the electronic device according to the first embodiment.

Then, a fourth modified example of the first embodiment will be explained with reference to FIG. 11. FIG. 11 is a cross-sectional view schematically showing an electronic device 104 according to the fourth modified example. As shown in the drawing, the electronic device 104 according to the fourth modified example has a configuration in which the alignment marks 60 described above are provided to the electronic device 102 according to the second modified example.

The electronic device 104 according to the fourth modified example can be provided with the features described above similarly to the electronic device 103 according to the third embodiment.

1.2. Second Embodiment

Figure 12A:
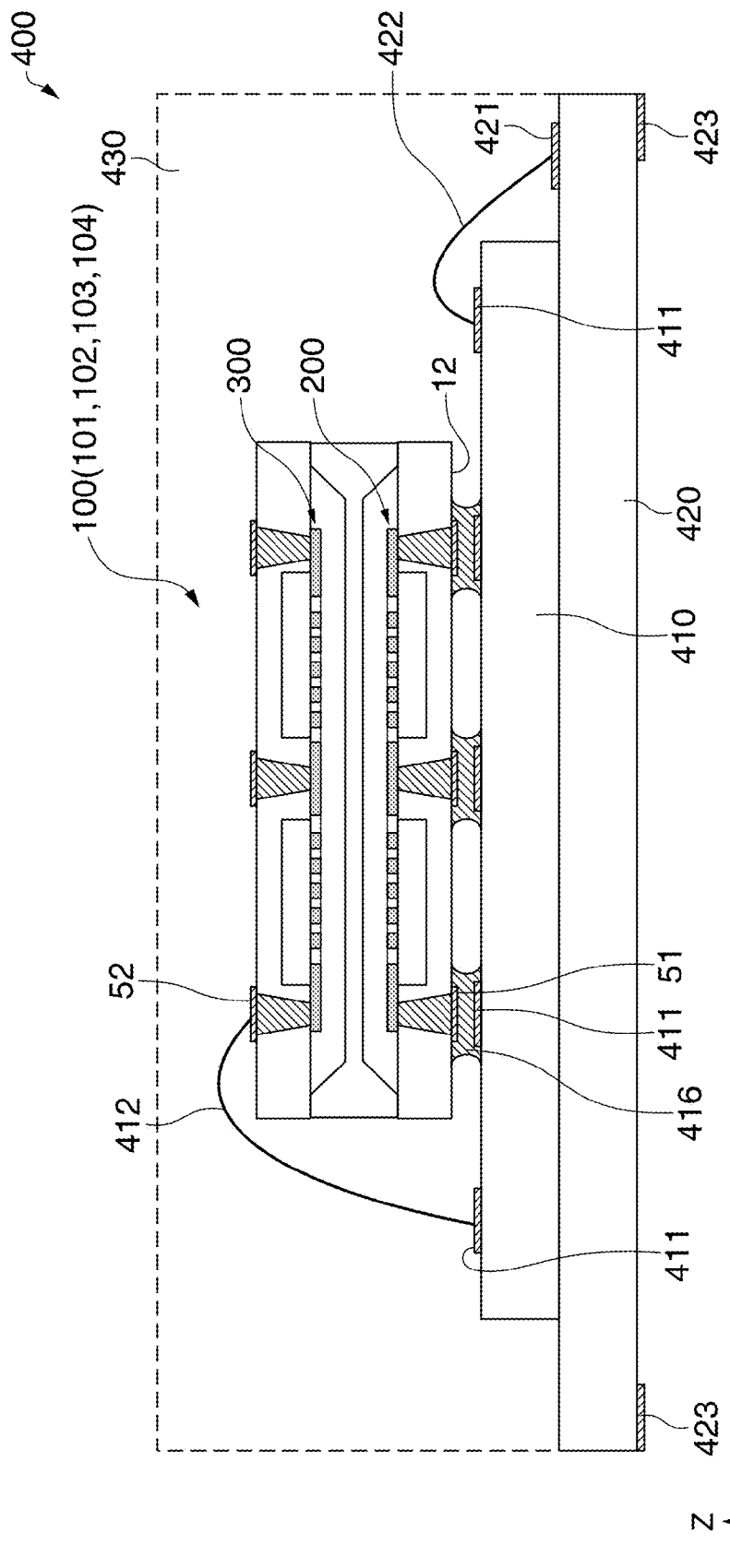
FIG. 12A is a cross-sectional view schematically showing an electronic device according to a second embodiment of the invention.

Then, an electronic device according to a second embodiment will be explained with reference to the accompanying drawings. FIG. 12A is a cross-sectional view schematically showing an electronic device 400 according to the second embodiment. For the sake of convenience, in the drawing, the X axis, the Y axis, and the Z axis are shown as the three axes perpendicular to each other.

As shown in the drawing, the electronic device 400 includes a substrate 410 having the electronic device 100 (101, 102, 103, or 104) according to the first embodiment mounted thereon, and including an integrated circuit for processing the signals of the first and second functional elements 200, 300, and a mold section 430 for sealing the package 40 (the first, second, and third base bodies 10, 20, and 30) and the substrate 410 by molding.

The substrate 410 is provided with a plurality of pads 411 electrically connected to the integrated circuit. The configuration of the integrated circuit is not particularly limited providing voltages are applied to the first functional element 200 and the second functional element 300, and the detection signals such as the capacitance from the first functional element 200 and the second functional element 300 can be processed. The integrated circuit can include, for example, an active element such as a transistor, or a passive element such as a resistor, an inductor, or a capacitor.

The pads 411 are electrically connected to the electrically-conductive layers 51, 52 of the electronic device 100, respectively. Thus, it is possible to electrically connect the first functional element 200 and the second functional element 300 to the integrated circuit provided to the substrate 410.

In the example shown in the drawing, the electrically-conductive layer 51 formed on the second surface 12 of the first base body 10 is mounted to the substrate 410 by flip-chip bonding, and the electrically-conductive layer 52 formed on the second surface 22 of the second base body 20 is mounted to the substrate 410 by wire bonding. Specifically, the electrically-conductive layer 51 and the pads 411 are electrically connected to each other via electrically-conductive members 416, and the electrically-conductive layer 52 and the pads 411 are electrically connected to each other via wires 412. Here, the electrically-conductive members 416 each can be solder, or a known electrically-conductive adhesive.

Here, although not shown in the drawing, it is also possible that the electrically-conductive layer 51 formed on the second surface 12 of the first base body 10 is mounted to the substrate 410 by wire bonding, and the electrically-conductive layer 52 formed on the second surface 22 of the second base body 20 is mounted to the substrate 410 by flip-chip bonding.

Further, as shown in the drawing, the substrate 410 can also be mounted on a wiring board 420. The wiring board 420 can be provided with, for example, pads 421 formed on the surface on which the substrate 410 is mounted, and can be connected by wire bonding using the pads 421 and wires 422. Further, the wiring board 420 can be provided with external terminals 423 formed on the opposite surface to the surface on which the pads 421 are formed.

The material of the wiring board 420 is not particularly limited, but a silicon substrate, a glass substrate, a ceramics substrate, a plastic substrate, and so on can be cited. Further, the wiring board 420 can be a substrate or a film formed of polyethylene terephthalate (PET). Alternatively, as the wiring board 420, a flexible board formed of polyimide resin can also be used. It is also possible to use a flexible printed circuit (FPC) or a tape substrate used in the tape automated bonding (TAB) technology as the flexible board for the wiring board 420.

The mold section 430 seals at least the electronic device 100 and the substrate 410 by molding. The material of the mold section 430 is not particularly limited providing the material is a known resin mold.

According to the electronic device 400, an electronic device having the electronic device 100 modularized can be provided. Therefore, the electronic device 400, which is modularized and can make a contribution to miniaturization and space saving, can be provided.

Modified Example

Figure 12B:
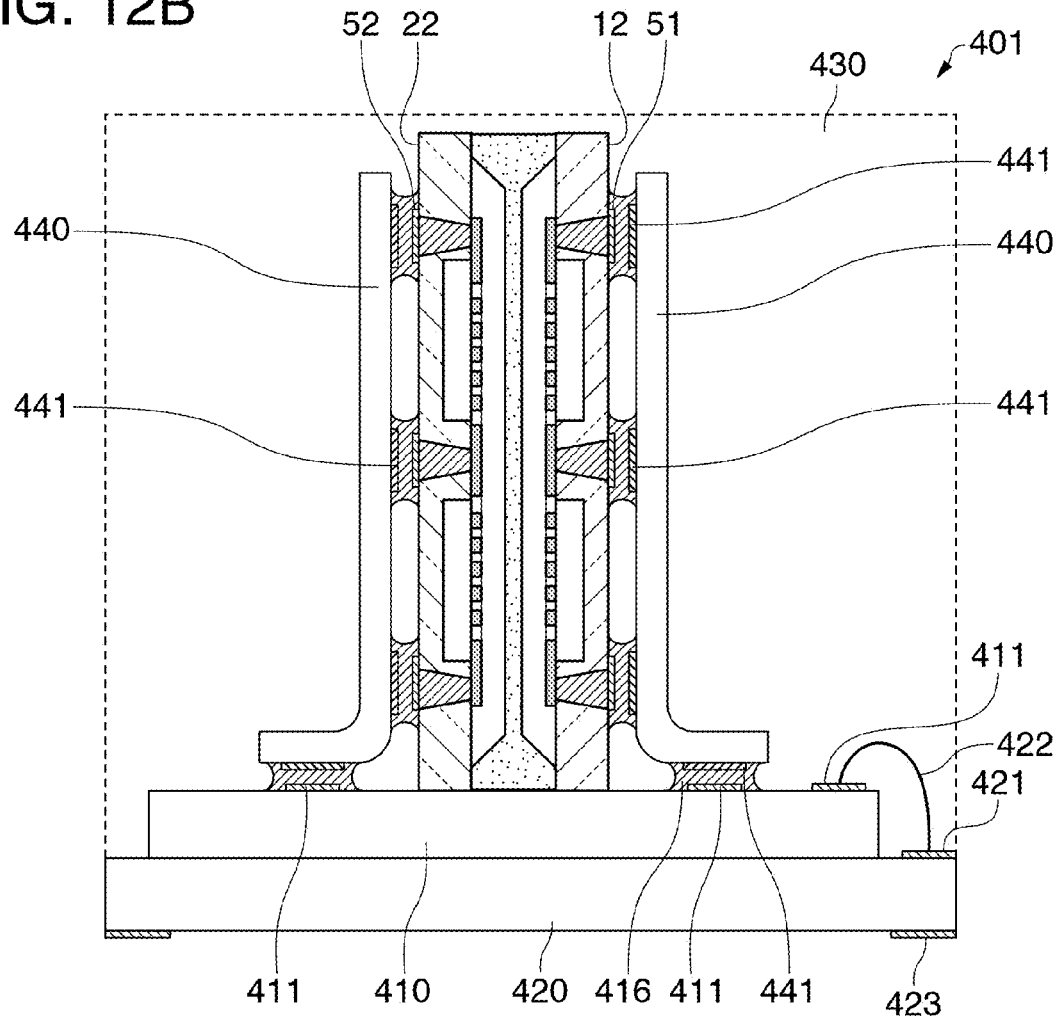
FIG. 12B is a cross-sectional view schematically showing a modified example of the electronic device according to the second embodiment.

Then, a modified example of the second embodiment will be explained with reference to FIG. 12B. FIG. 12B is a cross-sectional view schematically showing an electronic device 401 according to the modified example. As shown in the drawing, the electronic device 401 according to the modified example is different from the electronic device 400 according to the second embodiment only in the mounting configuration of the electronic device 100 (101, 102, 103, or 104).

In the electronic device 400 according to the second embodiment, the electronic device 100 is mounted by flip-chip bonding so that the second surface 12 of the first base body 10 (or the second surface 22 of the second base body 20) is opposed to the surface of the substrate 410 on which the pads 411 are formed. In contrast, in the electronic device 401 according to the modified example, the electronic device 100 is mounted so that the second surface 12 of the first base body 10 and the second surface 22 of the second base body 20 are substantially perpendicular to the surface of the substrate 410 on which the pads 411 are formed.

The electrical connection method between the electronic device 100 and the substrate 410 is not particularly limited. For example, it is also possible to achieve the electrical connection between the electronic device 100 and the substrate 410 using substrates 440 each provided with a plurality of pads 441 intervening between the electronic device 100 and the substrate 410. Specifically, the plurality of pads 441 is electrically connected to the electrically-conductive layers 51, 52 of the electronic device 100 and the pads 411 via electrically-conductive members 416. Thus, the electronic device 100 is electrically connected to the substrate 410 and the wiring board 420.

As the substrates 440, for example, a known flexible board can be used. It is possible to use, for example, a flexible printed circuit (FPC) or a tape substrate used in the tape automated bonding (TAB) technology as the flexible board. Further, although not shown in the drawing, a wiring board formed of a rigid substrate having an L-shaped cross-section can be used as the substrate 440.

The electronic device 401 according to the modified example can be provided with the features described above similarly to the electronic device 400 according to the second embodiment.

2. Method of Manufacturing Electronic Device

Figure 13:
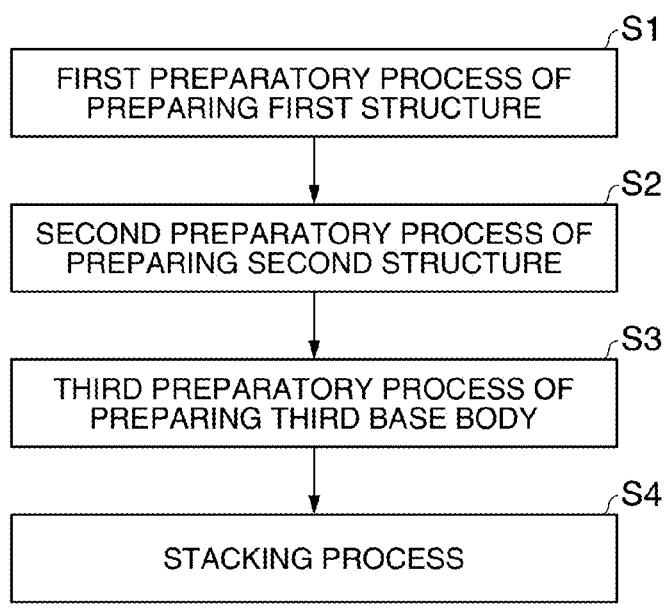
FIG. 13 is a flowchart showing a method of manufacturing an electronic device according to an embodiment of the invention.

Then, a method of manufacturing an electronic device according to the present embodiment will be explained with reference to the accompanying drawings. FIG. 13 is a flowchart of the method of manufacturing the electronic device 100 (103) according to the first embodiment. FIG. 14 through 21 are cross-sectional views schematically showing the manufacturing process of the electronic device 100 (103) according to the first embodiment, and each correspond to FIG. 1.

As shown in FIG. 13, the method of manufacturing an electronic device according to the present embodiment includes a first preparatory process (S1) of preparing the first base body 10 and then forming the first functional element 200 on the first base body 10 to thereby prepare a first structure 10a, a second preparatory process (S2) of preparing the second base body 20 and then forming the second functional element 300 on the second base body 20 to thereby prepare a second structure 20a, a third preparatory process (S3) of preparing the third base body 30, and a stacking process (S4) of performing stacking so that the third base body 30 is sandwiched between the first base body 10 and the second base body 20 to thereby house the first functional element 200 in the first cavity 41 surrounded by the first base body 10 and the third base body 30, and house the second functional element 300 in the second cavity 42 surrounded by the second base body 20 and the third base body 30.

The method of manufacturing an electronic device according to the present embodiment does not limit the order of the first preparatory process (S1), the second preparatory process (S2), and the third preparatory process (S3). Further, the following detailed description is for explaining an example of the method of manufacturing the electronic device 100 (103), but does not limit the invention to this method.

First Preparatory Process (S1) and Second Preparatory Process (S2)

Figure 14:
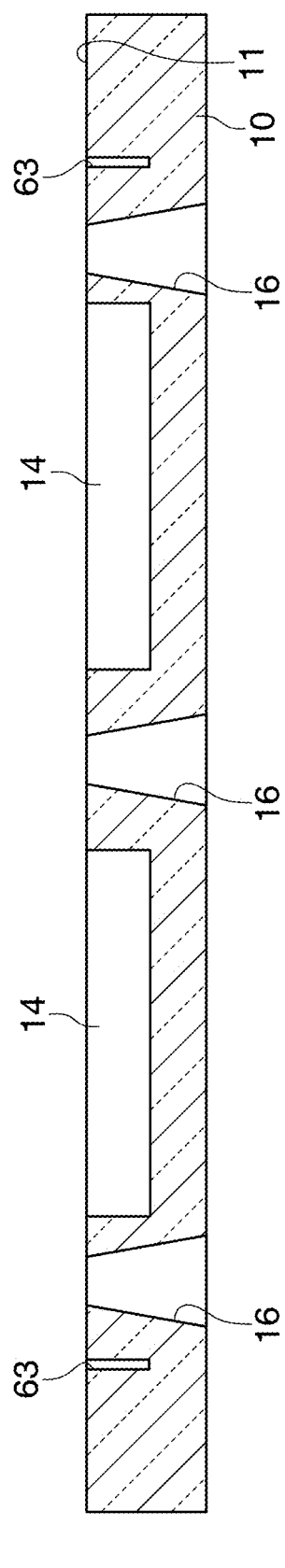
FIG. 14 is a cross-sectional view schematically showing the method of manufacturing an electronic device according to the embodiment.

Firstly, as shown in FIG. 14, the first base body 10 is prepared from a plate-like substrate made of, for example, glass. As shown in the drawing, the first recessed sections 14 and the through holes 16 are provided to the first surface 11 of the first base body 10. On this occasion, it is possible to form the groove sections 63 of the alignment marks 60 simultaneously when forming the first recessed sections 14, for example. The method of forming the first recessed sections 14 and the through holes 16 is not particularly limited, but a known MEMS processing method can be used. It is also possible to form the first recessed sections 14 by, for example, a known photolithography technology and a known etching technology, and to form the through holes 16 by, for example, blast processing.

Further, although not shown in the drawing, in the case of manufacturing the electronic device according to the first modified example, it is also possible to arbitrarily perform patterning so that the first base body 10 is provided with the frame body 19 in the present process (see FIG. 8).

Figure 15:
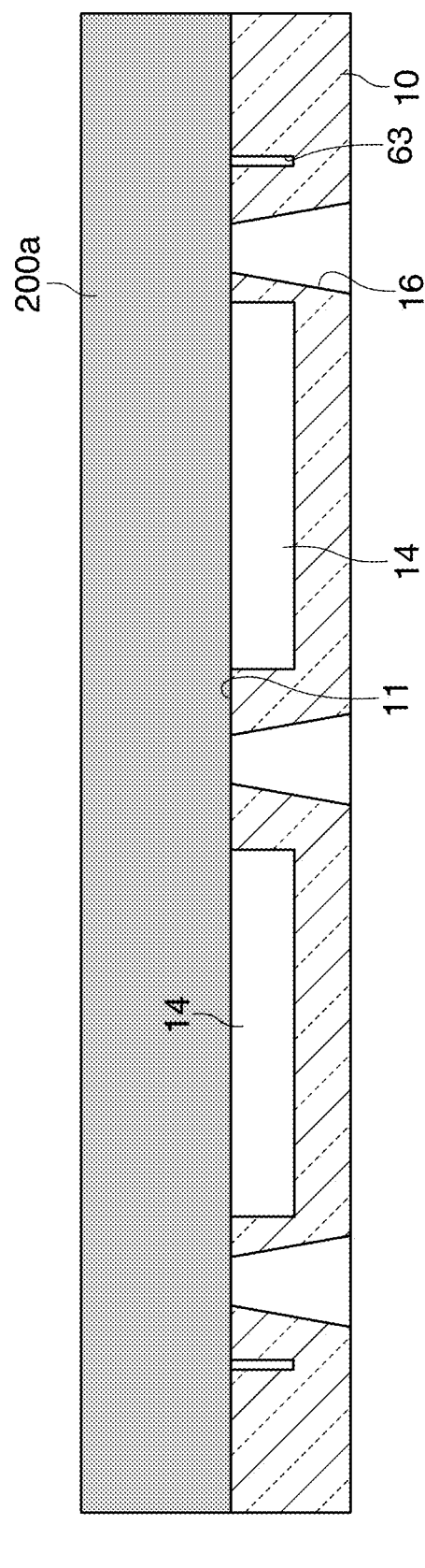
FIG. 15 is a cross-sectional view schematically showing the method of manufacturing an electronic device according to the embodiment.
Figure 15:
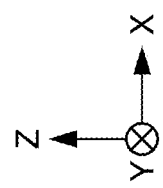

Then, as shown in FIG. 15, a material substrate 200a of the first functional element 200 is bonded to the first surface 11 of the first base body 10. Here, the material substrate 200a is formed of a silicon substrate, and is thicker than the first functional element 200. Bonding between the material substrate 200*a* and the first base body 10 is performed by, for example, anodic bonding.

Figure 16:
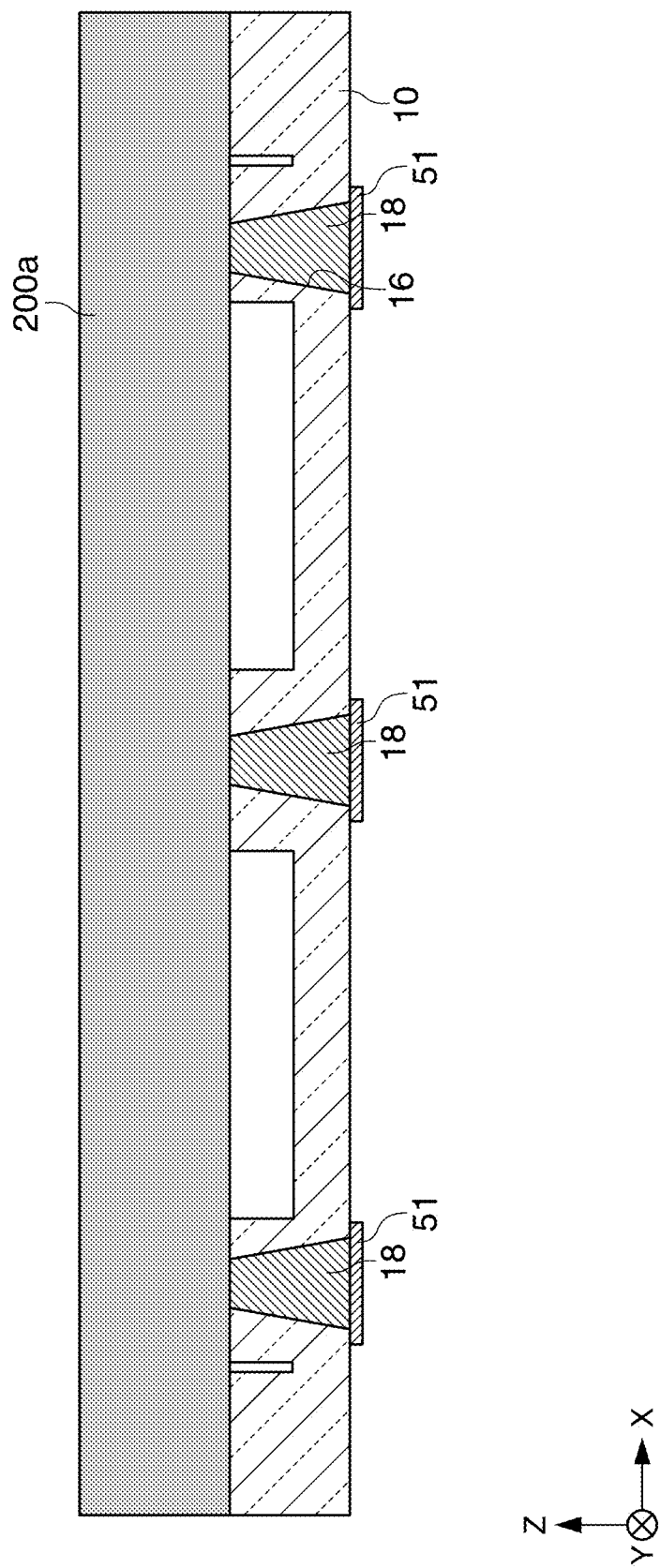
FIG. 16 is a cross-sectional view schematically showing the method of manufacturing an electronic device according to the embodiment.

Subsequently, as shown in FIG. 16, the electrically-conductive members 18 are formed respectively in the through holes 16. The method of forming the electrically-conductive members 18 is not particularly limited, but it is also possible to form the electrically-conductive members 18 to form penetrating electrodes by, for example, forming a foundation layer on the surface, and then performing a Cu plating process. Further, as shown in the drawing, the electrically-conductive layer 51 electrically connected to the electrically-conductive members 18 can be formed. The electrically-conductive layer 51 is formed by, for example, being deposited by a sputtering method or a chemical vapor deposition (CVD) method, and then being patterned using a photolithography technology and an etching technology.

Figure 17:
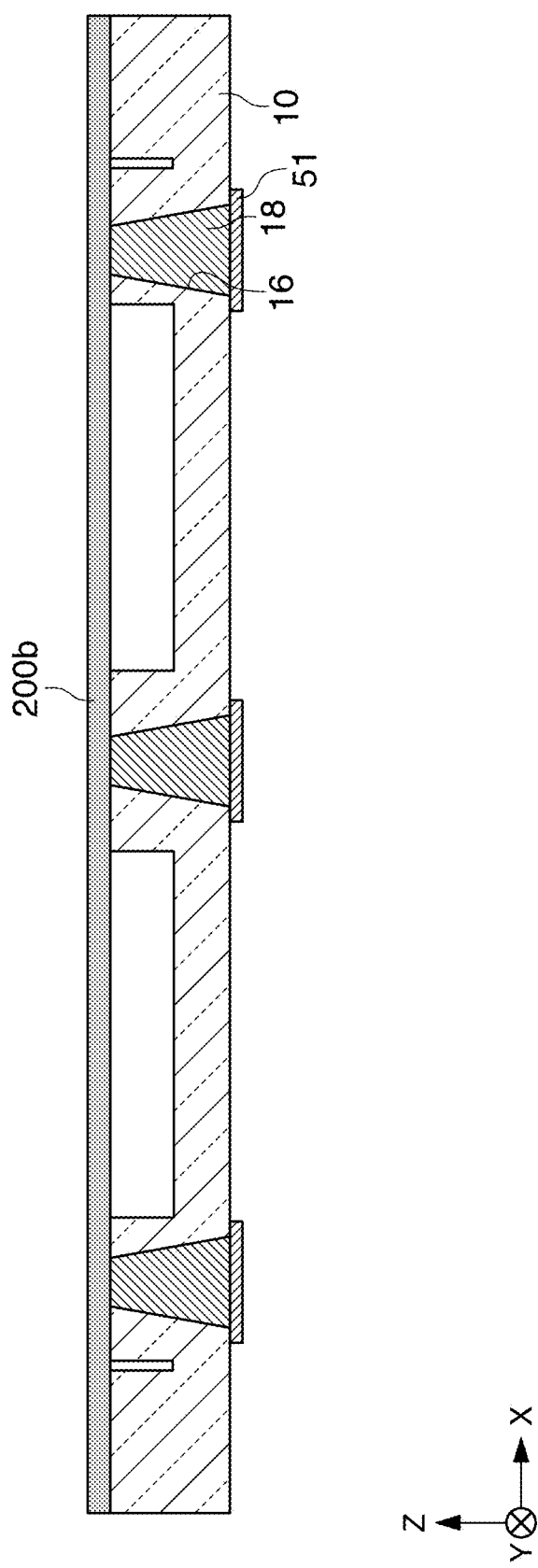
FIG. 17 is a cross-sectional view schematically showing the method of manufacturing an electronic device according to the embodiment.

Then, as shown in FIG. 17, the material substrate 200*a* is thinned by a known grinding and polishing process until the material substrate 200*b* having a desired film thickness is obtained. For example, the material substrate 200*a* can be thinned by a chemical mechanical polishing process (CMP).

Figure 18:
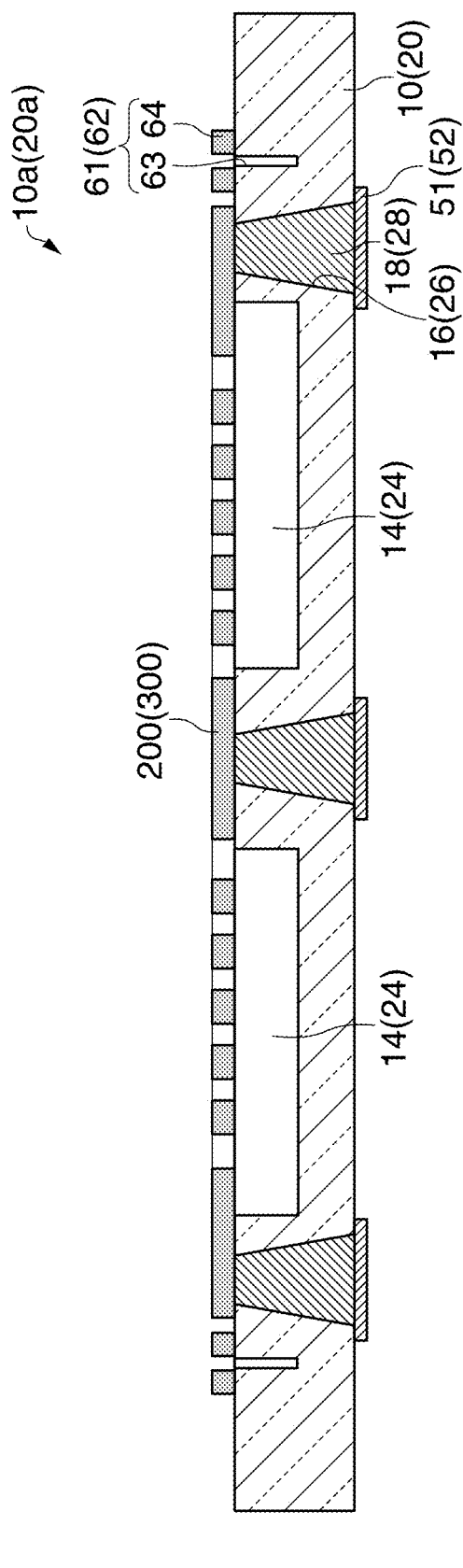
FIG. 18 is a cross-sectional view schematically showing the method of manufacturing an electronic device according to the embodiment.

Subsequently, as shown in FIG. 18, by patterning the material substrate 200*b* thus thinned to have a desired film thickness, the first functional element 200 is formed. The patterning process is performed using the photolithography technology and the etching technology.

Here, in the case of forming the alignment marks 61 as shown in the drawing, the structures 64 of the alignment marks 61 are formed by patterning the material substrate 200*b*. Therefore, the structures 64 and the first functional element 200 are formed simultaneously.

By the process described above, the first structure 10*a* provided with the first functional element 200 can be prepared.

Further, in the case of forming the second functional element 300 by patterning the material substrate 200*b* thus thinned to have the desired film thickness in the present process, the second structure 20*a* provided with the second functional element 300 can be prepared.

Third Preparatory Process (S3)

Figure 19:
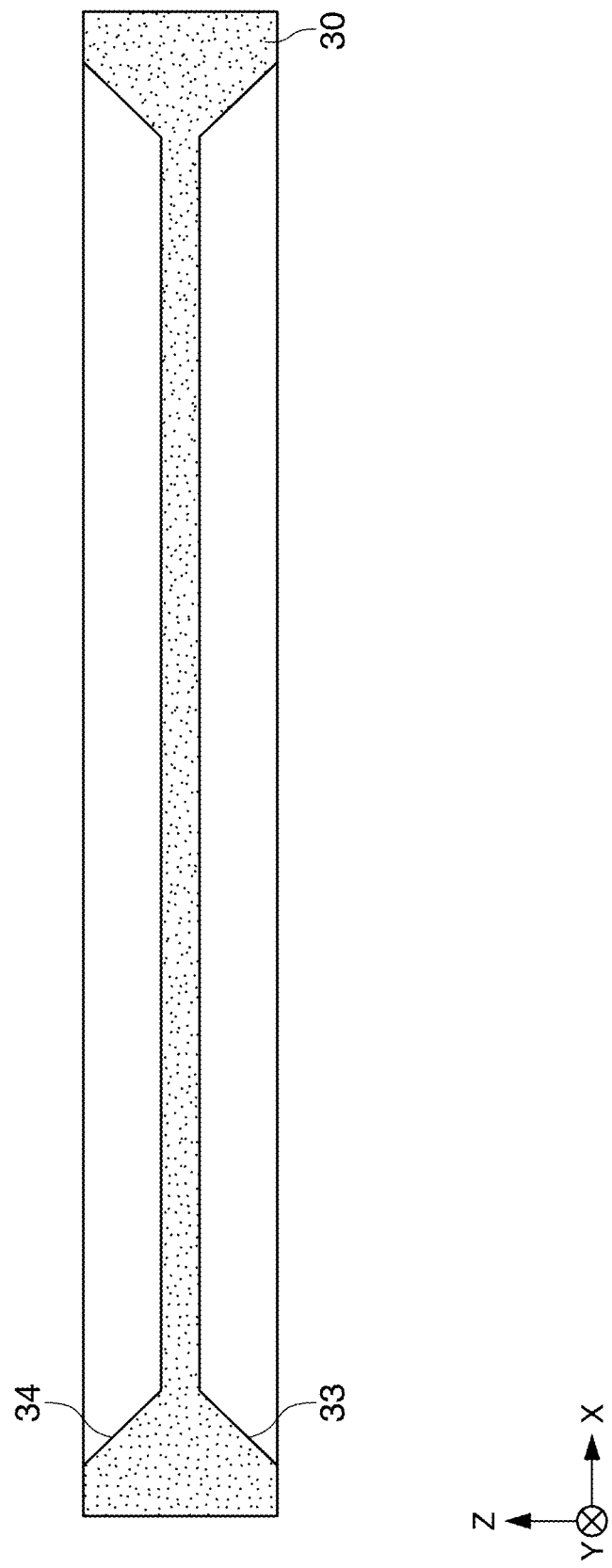
FIG. 19 is a cross-sectional view schematically showing the method of manufacturing an electronic device according to the embodiment.

Subsequently, as shown in FIG. 19, the third base body 30 is prepared. The third base body 30 is formed by preparing a silicon substrate and then forming the first recessed section 33 and the second recessed section 34 using the photolithography technology and the etching technology.

Further, although not shown in the drawing, in the case of manufacturing the electronic device according to the second modified example, it is also possible to arbitrarily perform patterning so that the third base body 330 is provided with the opening section 331 in the present process (see FIG. 9).

Stacking Process (S4)

Figure 20:
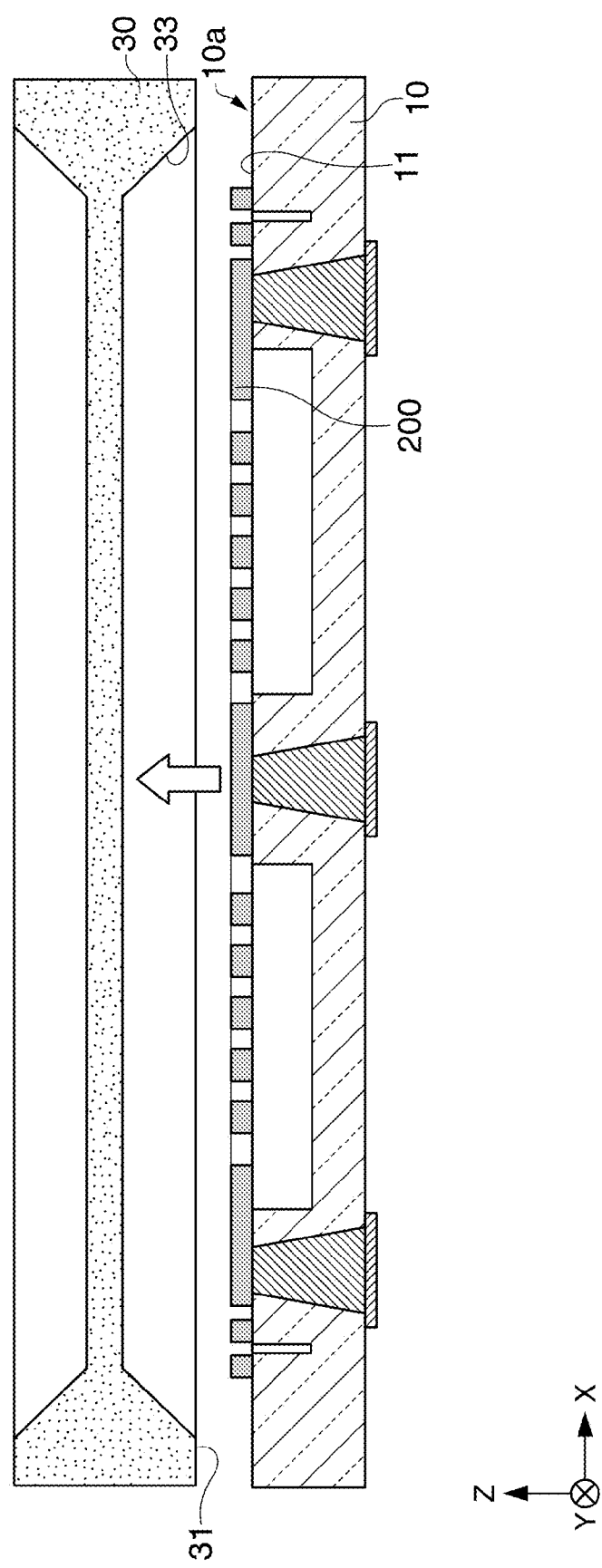
FIG. 20 is a cross-sectional view schematically showing the method of manufacturing an electronic device according to the embodiment.

Then, as shown in FIG. 20, by bonding the first structure 10*a* and the third base body 30 to each other, the first functional element 200 is housed in the first cavity 41 surrounded by the first base body 10 and the third base body 30. Bonding between the first structure 10*a* and the third base body 30 is performed by, for example, anodic bonding.

Here, by bonding the first structure 10*a* and the third base body 30 to each other in the desired first pressure atmosphere, the first cavity 41 of the first pressure atmosphere can be formed. The first pressure atmosphere is appropriately determined depending on the type of the functional element housed therein. The first pressure atmosphere can be a reduced-pressure atmosphere (preferably a vacuum atmosphere), or can be an atmosphere of an inert gas such as a nitrogen gas.

In the case in which the first functional element 200 is, for example, a vibrating gyro sensor, since it is preferable for the first cavity 41 to be in a reduced-pressure state (more preferably in a vacuum state), the first pressure atmosphere is the reduced-pressure state (more preferably in the vacuum state). Further, in the case in which the first functional element 200 is, for example, an acceleration sensor, since it is preferable for the first cavity 41 to be in the atmospheric pressure state, and in an inert gas atmosphere (e.g., a nitrogen gas atmosphere), the first pressure atmosphere is the atmospheric pressure state, and in the inert gas atmosphere (e.g., the nitrogen gas atmosphere).

Figure 21:
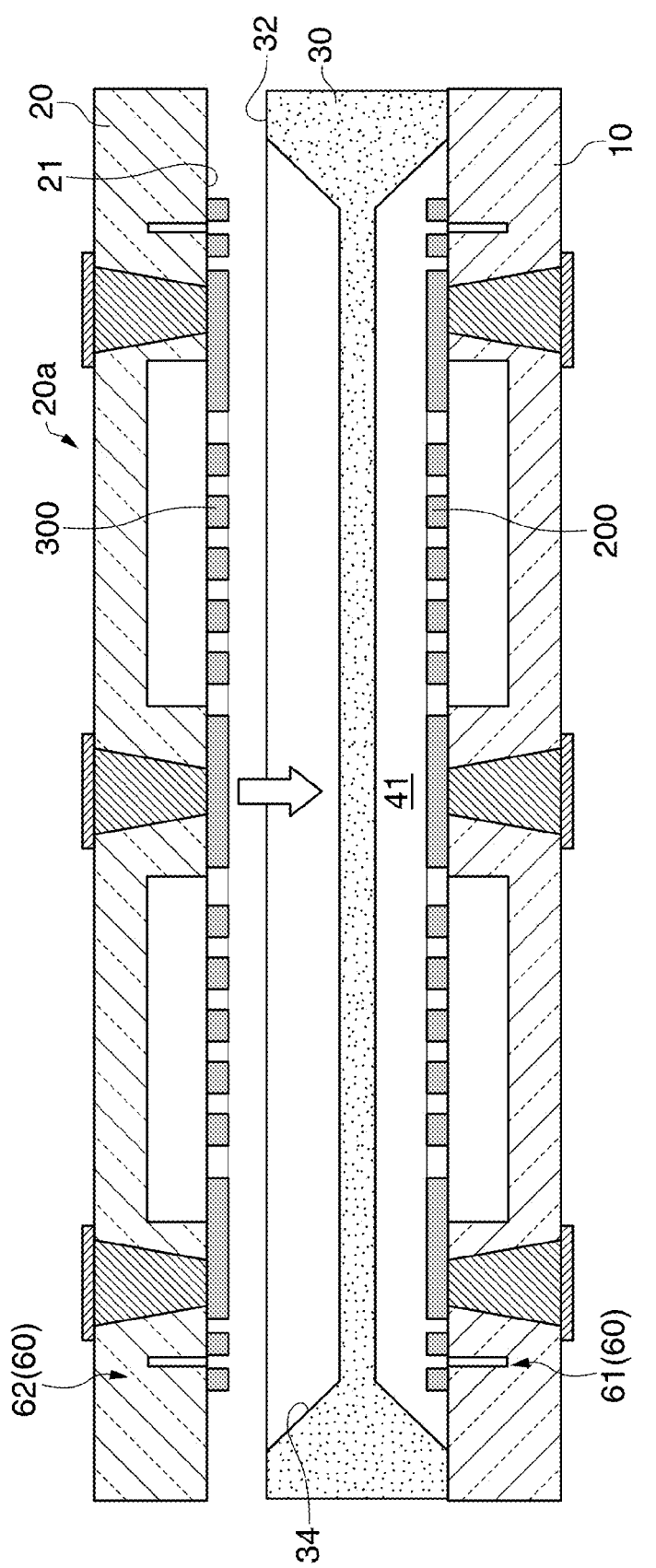
FIG. 21 is a cross-sectional view schematically showing the method of manufacturing an electronic device according to the embodiment.

Then, as shown in FIG. 21, by bonding the second structure 20*a* and the third base body 30 to each other, the second functional element 300 is housed in the second cavity 42 surrounded by the second base body 20 and the third base body 30. Bonding between the second structure 20*a* and the third base body 30 is performed by, for example, anodic bonding.

Here, by bonding the second structure 20*a* and the third base body 30 to each other in the desired second pressure atmosphere, the second cavity 42 of the second pressure atmosphere can be formed. The second pressure atmosphere is appropriately determined depending on the type of the functional element housed therein. The second pressure atmosphere can be a reduced-pressure atmosphere (preferably a vacuum atmosphere), or can be an atmosphere of an inert gas such as a nitrogen gas.

In the case in which the second functional element 300 is, for example, a vibrating gyro sensor, since it is preferable for the second cavity 42 to be in a reduced-pressure state (more preferably in a vacuum state), the second pressure atmosphere is the reduced-pressure state (more preferably in the vacuum state). Further, in the case in which the second functional element 300 is, for example, an acceleration sensor, since it is preferable for the second cavity 42 to be in the atmospheric pressure state, and in an inert gas atmosphere (e.g., a nitrogen gas atmosphere), the second pressure atmosphere is the atmospheric pressure state, and in the inert gas atmosphere (e.g., the nitrogen gas atmosphere).

Further, in the case in which the alignment marks 60 (the first alignment marks 61 and the second alignment marks 62) are provided respectively to the first structure 10*a* and the second structure 20*a*, the stacking process (S4) further includes a process of performing the alignment by visually detecting the first alignment marks 61 and the second alignment marks 62. According to this process, since the alignment can reliably be performed in the process of stacking the first base body 10, the second base body 20, and the third base body 30 on each other, it is possible for the functional elements to have the detection axes aligned with higher alignment accuracy.

According to the process described hereinabove, the electronic device 100 can be manufactured.

The method of manufacturing an electronic device according to the present embodiment has, for example, the following features.

According to the method of manufacturing an electronic device related to the present embodiment, since an electronic device having the first functional element 200 and the second functional element 300 stacked on each other can be provided, it is possible to provide a method of manufacturing an electronic device making a contribution to miniaturization and space saving of the device.

Further, according to the method of manufacturing an electronic device related to the present embodiment, since the electronic device having the first functional element 200 and the second functional element 300 stacked on each other can be provided, the detection axes of the functional elements can easily be arranged with high alignment accuracy. Therefore, it is possible to provide an electronic device simplifying the manufacturing process and having the detection axes with high alignment accuracy.

Further, according to the method of manufacturing an electronic device related to the present embodiment, a cavity sealed in a desired pressure atmosphere can be formed by performing the stacking process in the desired pressure atmosphere. Therefore, it is not required to perform a sealing process of sealing the cavity by melting an electrically-conductive member in a sealing through hole using a laser or the like in a reduced-pressure state, and it is possible to seal the cavity with an easier method.

Further, according to the method of manufacturing an electronic device related to the present embodiment, since the first functional element 200 and the second functional element 300 are not formed on the same substrate, but are individually provided to the first base body 10 and the second base body 20, it is possible to prevent the reliability of the functional elements mounted thereon from degrading.

For example, in the case in which the gyro sensor is included in at least one of the first functional element 200 and the second functional element 300, it is necessary to drive the gyro sensor to vibrate for the requirement of the manufacturing process. In the case of forming the first functional element 200 and the second functional element 300 on the same substrate, there is a possibility that the vibration propagates to the other functional element to degrade the reliability of the functional element. In contrast, according to the method of manufacturing an electronic device related to the present embodiment, it is possible to prevent the reliability of the element from degrading due to the vibration and so on.

Further, according to the method of manufacturing an electronic device related to the present embodiment, since the first functional element 200 and the second functional element 300 are not formed on the same substrate, the influence on the yield ratio can be reduced.

For example, even in the case in which only either one of the first functional element 200 and the second functional element 300 is defective, since the first functional element 200 and the second functional element 300 are formed on the same substrate, the yield ratio is dramatically degraded. In contrast, according to the method of manufacturing an electronic device related to the present embodiment, the functional elements are respectively provided to the first base body 10 and the second base body 20. Therefore, even in the case in which a failure occurs in one of the functional elements, it is not required to treat the other of the functional elements as a defective, and therefore, the influence on the yield ratio can be reduced.

Modified Example

Then, a modified example of the present embodiment will be explained with reference to FIGS. 22A, 22B, 23A, 23B, and 24. FIGS. 22A, 22B, 23A, and 23B are diagrams for schematically explaining the first through third preparatory processes (S1 through S3) according to the modified example. FIG. 24 is a diagram for schematically explaining the stacking process (S4) according to the modified example.

In the method of manufacturing an electronic device according to the present embodiment, the first preparatory process (S1), the second preparatory process (S2), the third preparatory process (S3), and the stacking process (S4) are performed wafer by wafer.

First Through Third Preparatory Processes (S1 Through S3)

In the first preparatory process (S1), a first wafer 2000 having a plurality of the first structures 10a in a first element region 2010 is prepared. Here, FIG. 22A is a plan view of the first wafer 2000, and FIG. 22B is a cross-sectional view along the B-B line in FIG. 22A.

As shown in the drawings, the planner shape of the first wafer 2000 can be, for example, a roughly circular shape. As shown in FIG. 22A, the planner shape of the first wafer 2000 can partially be cut out.

Figure 22A:
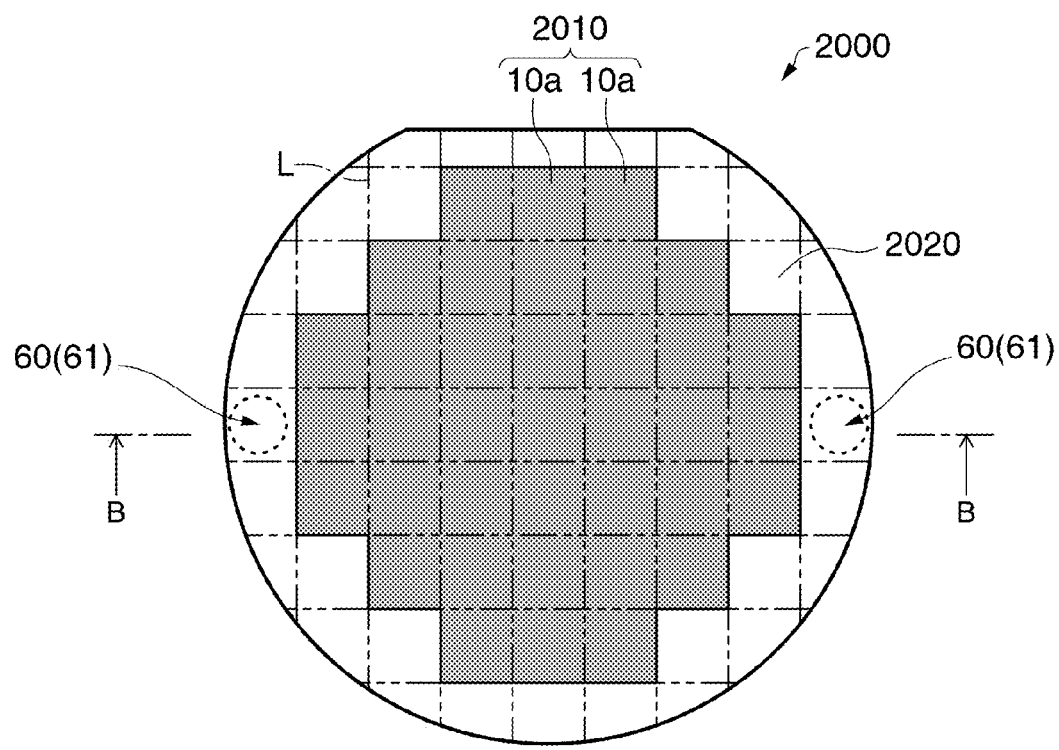
FIGS. 22A and 22B are diagrams schematically showing the method of manufacturing an electronic device according to a modified example.

As shown in FIG. 22A, the first wafer 2000 includes the first element region 2010 (the region indicated by gray color in FIG. 22A) as the region where the plurality of first structures 10a is formed, and a non-element region 2020 (the region indicated by white color in FIG. 22A).

Figure 22B:
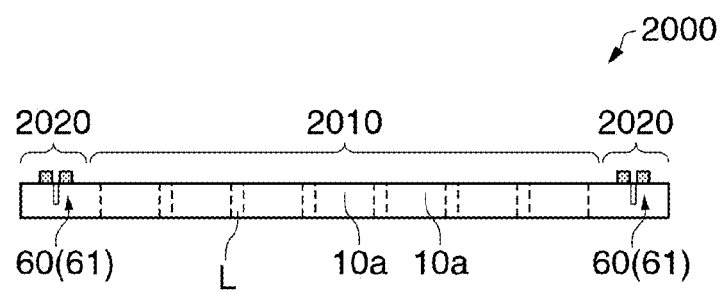

As shown in FIG. 22B, the first element region 2010 can be formed in a central portion of the first wafer 2000. As shown in FIG. 22A, cutting lines L each show a boundary line between the first structures 10a adjacent to each other. Therefore, an area sectioned by the cutting lines L corresponds to an area to form the first structure 10a after cutting is performed.

Here, as shown in the drawing, the first alignment marks 61 can be formed outside the first element region 2010 (the non-element region 2020) of the first wafer 2000.

Figure 23A:
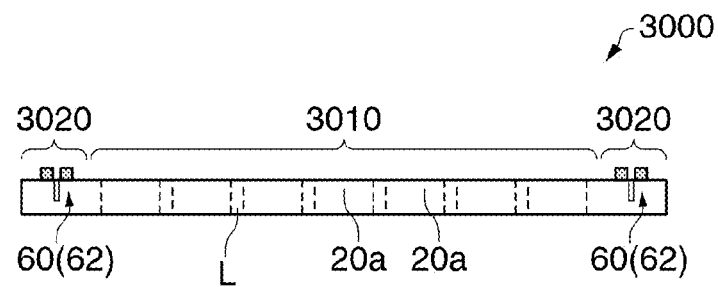
FIGS. 23A and 23B are cross-sectional views schematically showing the method of manufacturing an electronic device according to the modified example.
Figure 24:
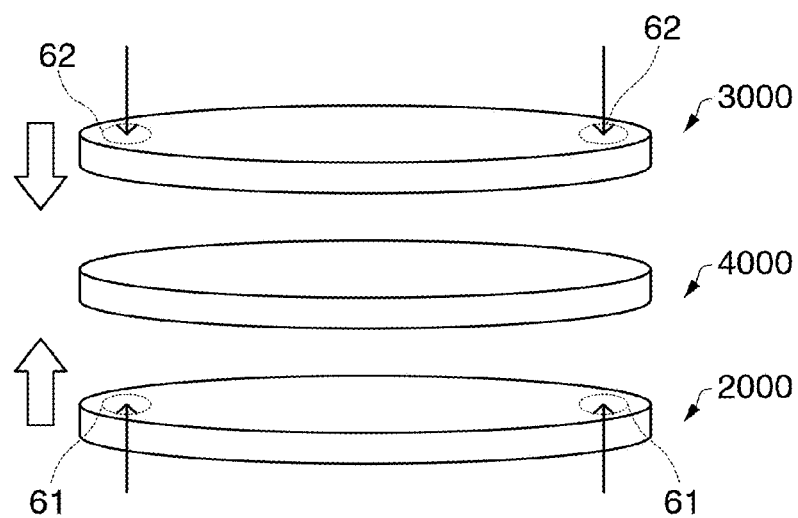
FIG. 24 is a perspective view schematically showing the method of manufacturing an electronic device according to the modified example.

In the second preparatory process (S2), as shown in FIG. 23A, a second wafer 3000 having a plurality of the second structures 20a in a second element region 3010 is prepared similarly to the first wafer 2000. As shown in the drawing, the second wafer 3000 includes the second element region 3010 as the region where the plurality of second structures 20a is formed, and a non-element region 3020.

Here, as shown in the drawing, the second alignment marks 62 can be formed outside the second element region 3010 (the non-element region 3020) of the second wafer 3000.

Figure 23B:
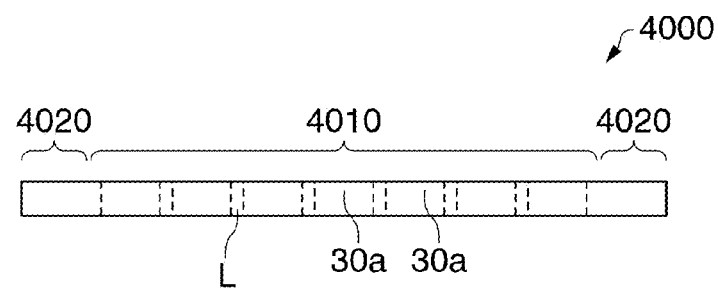

In the third preparatory process (S3), as shown in FIG. 23B, a third wafer 4000 having a plurality of the third base bodies 30 in a third element region 4010 is prepared. As shown in the drawing, the third wafer 4000 includes the third element region 4010 as the region where the plurality of third base bodies 30 is formed, and a non-element region 4020.

Stacking Process (S4)

As shown in FIG. 24, the stacking process is also performed wafer by wafer. Specifically, it is possible to form a wafer including a plurality of electronic devices 100 each composed of the first structure 10a, the second structure 20a, and the third base body 30 by bonding the first wafer 2000 and the third wafer 4000 to each other, and bonding the second wafer 3000 and the third wafer 4000 to each other.

The method of manufacturing an electronic device according to the modified example further includes a process of segmenting the first, second, and third wafers 2000, 3000, and 4000 thus stacked on each other using a known cutting technology such as dicing after the stacking process. Dicing is performed along the cutting lines L.

According to the method of manufacturing an electronic device related to the modified example, since the manufacturing is performed wafer by wafer, a larger number of electronic devices 100 can more efficiently be manufactured.

Further, as shown in the drawings, since the alignment can reliably be performed in the process of stacking the wafers by using the first alignment marks 61 and the second alignment marks 62, it is possible for the functional elements to have the detection axes aligned with higher alignment accuracy. Further, since there is no need to provide the alignment marks in the electronic device, further miniaturization and space saving can be achieved. Further, since the alignment process can be performed wafer by wafer, the manufacturing can more easily be performed compared to the case of individually performing the visual check and then performing the alignment.

3. Electronic Apparatuses

Then, electronic apparatuses according to the first embodiment will be explained with reference to the accompanying drawings. The electronic apparatuses according to the first embodiment each include the electronic device according to the invention. Hereinafter, the electronic apparatuses each including the electronic device 100 as the electronic device according to the invention will be explained.

Figure 25:
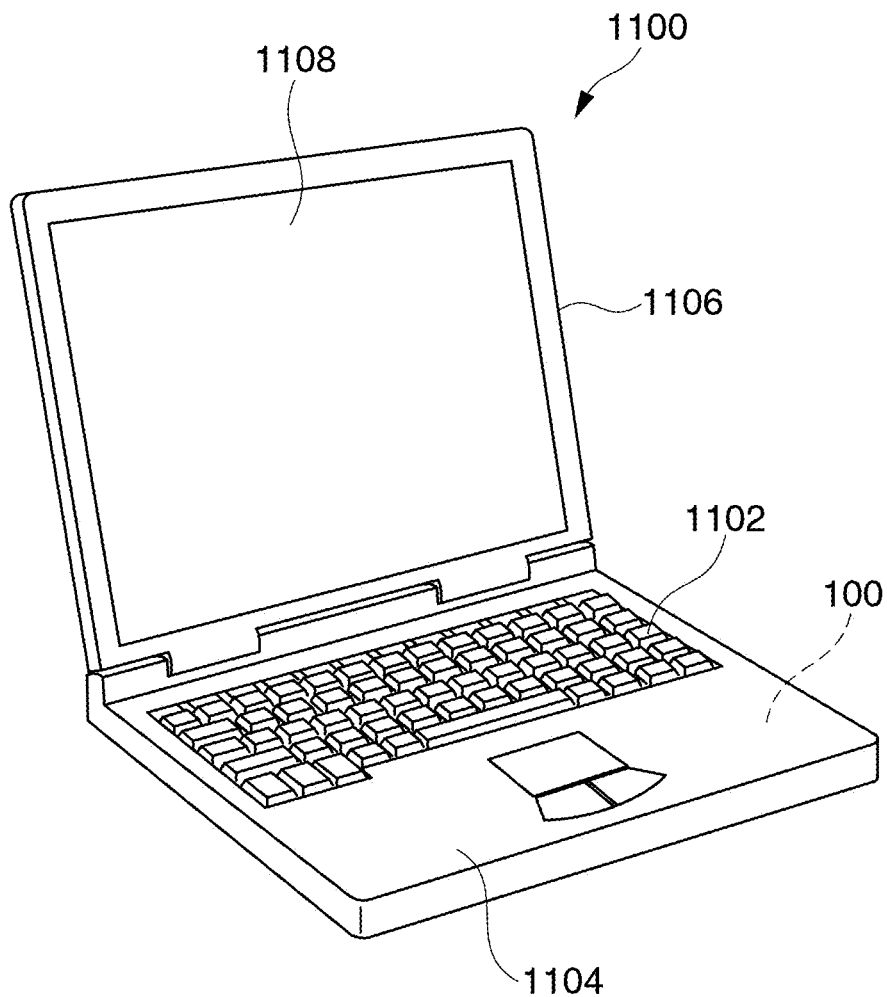
FIG. 25 is a perspective view schematically showing an electronic apparatus.

FIG. 25 is a perspective view schematically showing a mobile type (or laptop type) personal computer 1100 as the electronic apparatus according to the first embodiment.

As shown in FIG. 25, the personal computer 1100 is composed of a main body section 1104 equipped with a keyboard 1102, and a display unit 1106 equipped with a display section 1108, and the display unit 1106 is pivotally supported with respect to the main body section 1104 via a hinge structure.

Such a personal computer 1100 incorporates the electronic device 100.

Figure 26:
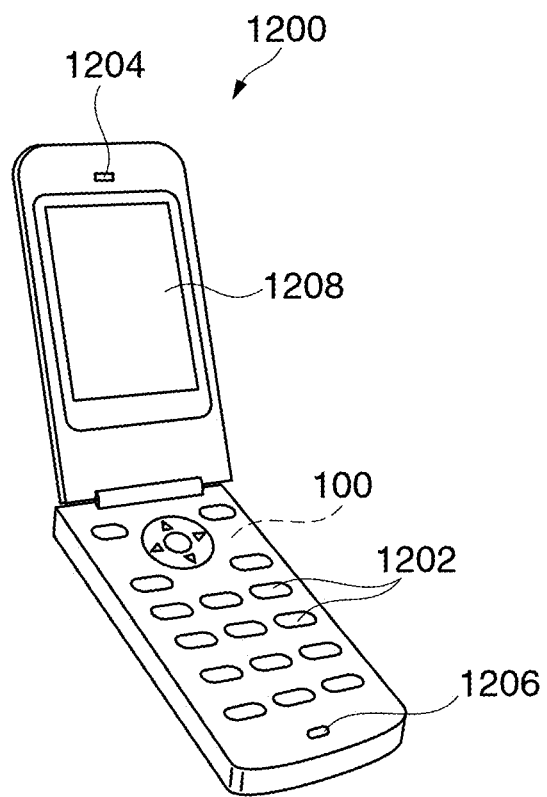
FIG. 26 is a perspective view schematically showing another electronic apparatus.

FIG. 26 is a perspective view schematically showing a cellular phone (including PHS) 1200 as the electronic apparatus according to the first embodiment.

As shown in FIG. 26, the cellular phone 1200 is provided with a plurality of operation buttons 1202, an ear piece 1204, and a mouthpiece 1206, and a display section 1208 is disposed between the operation buttons 1202 and the ear piece 1204.

Such a cellular phone 1200 incorporates the electronic device 100.

Figure 27:
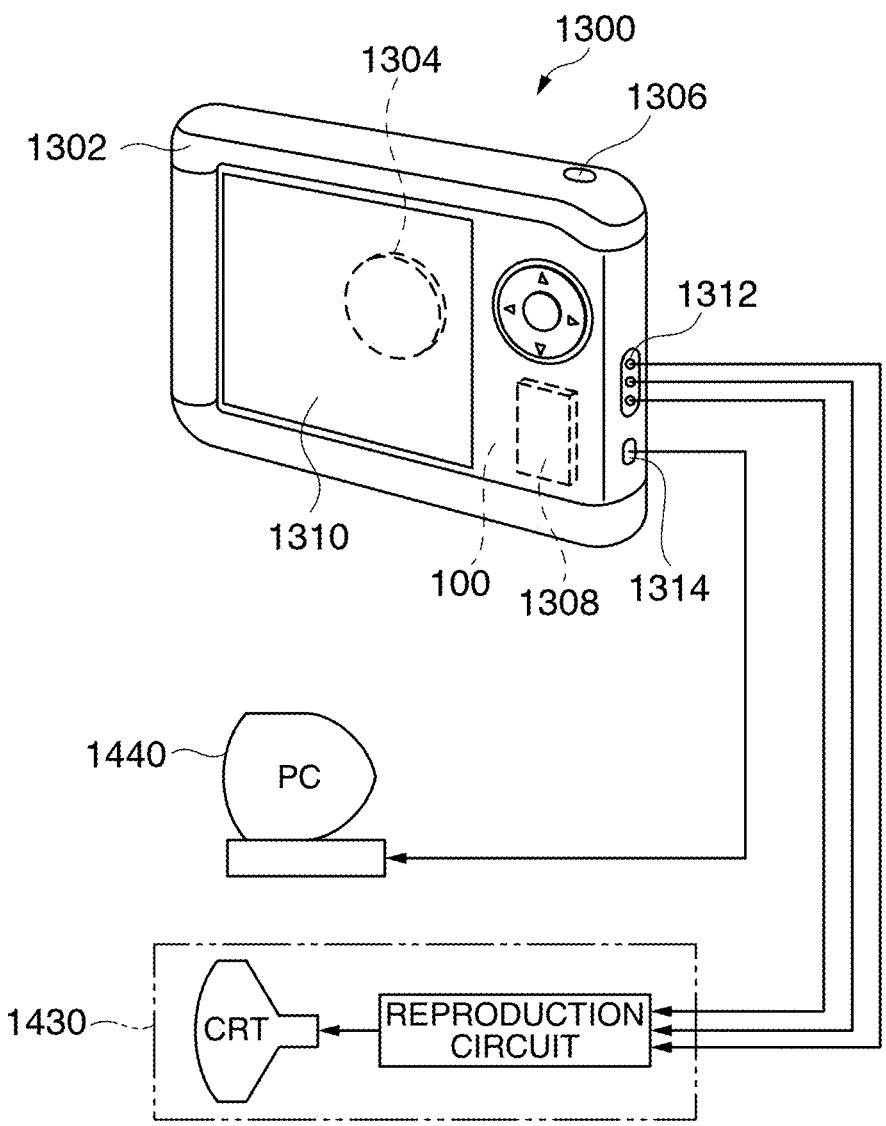
FIG. 27 is a perspective view schematically showing another electronic apparatus.

FIG. 27 is a perspective view schematically showing a digital still camera 1300 as the electronic apparatus according to the first embodiment. It should be noted that FIG. 27 also shows the connection with external equipment schematically.

Here, typical cameras expose silver salt films to optical images of objects, while the digital still camera 1300 performs photoelectric conversion on optical images of objects by imaging elements such as CCD (charge coupled device) to generate imaging signals (image signals).

The case (body) 1302 of the digital still camera 1300 is provided with a display section 1310 disposed on the back surface thereof to have a configuration of performing display in accordance with the imaging signal from the CCD, wherein the display section 1310 functions as a viewfinder for displaying the objects as electronic images.

Further, the front surface (the back side in the drawing) of the case 1302 is provided with a light receiving unit 1304 including an optical lens (an imaging optical system), the CCD, and so on.

When the photographer confirms an object image displayed on the display section 1310, and then holds down a shutter button 1306, the imaging signal from the CCD at that moment is transferred to and stored in the memory device 1308.

Further, the digital still camera 1300 is provided with video signal output terminals 1312 and an input-output terminal 1314 for data communication disposed on a side surface of the case 1302. Further, a television monitor 1430 and a personal computer 1440 are connected to the video signal output terminals 1312 and the input-output terminal 1314 for data communication, respectively, according to needs. Further, there is adopted the configuration in which the imaging signal stored in the memory device 1308 is output to the television monitor 1430 and the personal computer 1440 in accordance with a predetermined operation.

Such a digital still camera 1300 incorporates the electronic device 100.

The electronic apparatuses 1100, 1200, and 1300 can include the electronic device 100 capable of making a contribution to miniaturization and space saving.

It should be noted that, as the electronic apparatus equipped with the electronic device 100 described above, there can be cited in addition to the personal computer (the mobile personal computer) shown in FIG. 25, the cellular phone shown in FIG. 26, and the digital still camera shown in FIG. 27, for example, an inkjet ejection device (e.g., an inkjet printer), a laptop personal computer, a television set, a video camera, a video cassette recorder, a variety of types of car navigation system, a pager, a personal digital assistance (including one with communication function), an electronic dictionary, an electric calculator, a computerized game machine, a head-mounted display, a word processor, a workstation, a video phone, a security video monitor, a pair of electronic binoculars, a POS terminal, a medical instrument (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, a rocket, or a ship), a posture control system for a robot or a human body, and a flight simulator.

The embodiments and the modified examples described above are illustrative only, and the invention is not limited thereto. For example, it is also possible to arbitrarily combine the embodiments and the modified examples described above with each other.

The invention includes configurations (e.g., configurations having the same function, the same way, and the same result, or configurations having the same object and the same advantages) substantially the same as the configuration described as the embodiments of the invention. Further, the invention includes configurations obtained by replacing a non-essential part of the configuration described as the embodiment of the invention. Further, the invention includes configurations exerting the same functional effects and configurations capable of achieving the same object as the configuration described as the embodiment of the invention. Further, the invention includes configurations obtained by adding known technologies to the configuration described as the embodiments of the invention.

The entire disclosure of Japanese Patent Application No. 2012-124576, filed May 31, 2012 is expressly incorporated by reference herein.

What is claimed is:
1. An electronic device comprising:
 a first base body having first and second surfaces, a first recess and a first through hole, the first recess being provided in the first surface, the first through hole being formed between the first and second surfaces, a first through electrode being provided in the first through hole;

a second base body having third and fourth surfaces, a second recess and a second through hole, the second recess being provided in the third surface, the second through hole being formed between the third and fourth surfaces, a second through electrode being provided in the second through hole;

a third base body held between the first base body and the second base body, the third base body having fifth and sixth surfaces and third and fourth recesses, the third recess being provided in the fifth surface, the fourth recess being provided in the sixth surface;

a first cavity formed by the first and third recesses;

a second cavity formed by the second and fourth recesses;

a first functional element disposed in the first cavity surrounded by the first base body and the third base body, the first functional element being a gyro sensor configured to detect an angular velocity, the first functional element including:
a vibration member;
a driving electrode; and
a detection electrode; and a second functional element disposed in the second cavity surrounded by the second base body and the third base body, the second functional element being an acceleration sensor configured to detect acceleration, the second functional element including:
a movable member;
a movable electrode;
a fixed member; and
a fixed electrode, wherein the first through electrode is electrically connected to one of the driving electrode and the detection electrode, and the second through electrode is electrically connected to one of the movable electrode and the fixed electrode.

2. The electronic device according to claim 1, wherein the first base body and the second base body are each provided with an alignment mark.

3. An electronic apparatus comprising:
the electronic device according to claim 2.

4. The electronic device according to claim 1, wherein the third base body has an opening section adapted to communicate the first cavity and the second cavity with each other.

5. An electronic apparatus comprising:
the electronic device according to claim 4.

6. The electronic device according to claim 1, wherein a material of the first and second base bodies is glass, and a material of the third base body is one of silicon and glass.

7. An electronic apparatus comprising:
the electronic device according to claim 6.

8. The electronic device according to claim 1, further comprising:
a substrate, which includes an integrated circuit adapted to process signals of the first and second functional elements, and to which the first base body is mounted; and
a mold section adapted to mold the first, second, and third base bodies and the substrate.

9. An electronic apparatus comprising:
the electronic device according to claim 8.

10. An electronic apparatus comprising:
the electronic device according to claim 1.

11. A method of manufacturing an electronic device comprising:

a first preparation step of preparing a first structure by preparing a first base body and then forming a first functional element on the first base body, the first base body has:
first and second surfaces;
a first recess;
a first through hole; and
a first through electrode, wherein the first recess is provided in the first surface, the first through hole is formed between the first and second surfaces, the first through electrode is provided in the first through hole;

a second preparation step of preparing a second structure by preparing a second base body and then forming a second functional element on the second base body, the second base body has:
third and fourth surfaces;
a second recess;
a second through hole; and
a second throat electrode, wherein the second recess is provided in the third surface, the second through hole is formed between the third and fourth surfaces, the second through electrode is provided in the second through hole;

a third preparation step of preparing a third base body, the third base body has:
fifth and sixth surfaces; and
third and fourth recesses, wherein the third recess is provided in the fifth surface, the fourth recess is provided in the sixth recess; and a stacking step of housing the first functional element in a first cavity, which is formed by the first and third recesses, surrounded by the first base body and the third base body, and housing the second functional element in a second cavity, which is formed by the second and fourth recesses, surrounded by the second base body and the third base body by stacking the first base body, the second base body, and the third base body on each other so that the third base body is held between the first base body and the second base body, wherein the first functional element is a gyro sensor configured to detect an angular velocity, the gyro sensor including:
a vibration member;
a driving electrode; and
a detection electrode; and the second functional element is an acceleration sensor configured to detect acceleration, the acceleration sensor including:
a movable member;
a movable electrode;
a fixed member; and
a fixed electrode, wherein the first through electrode is electrically connected to one of the driving electrode and the detection electrode, and the second through electrode is electrically connected to one of the movable electrode and the fixed electrode.

12. The method of manufacturing an electronic device according to claim 11, wherein
the stacking step includes
a step of bonding the first base body and the third base body to each other in a first pressure atmosphere to thereby form the first cavity of the first pressure atmosphere, and
a step of bonding the second base body and the third base body to each other in a second pressure atmosphere to thereby form the second cavity of the second pressure atmosphere, and the first pressure atmosphere and the second atmosphere are different in pressure from each other.

13. The method of manufacturing an electronic device according to claim 11, wherein
the first preparation step further includes a step of forming at least one first alignment mark,
the second preparation step further includes a step of forming at least one second alignment mark,
the first alignment mark and the second alignment mark are simultaneously formed at the time of formation of the first functional element and the second functional element, respectively, and
the stacking step further includes a step of performing alignment by visually detecting the first alignment mark and the second alignment mark.

14. The method of manufacturing an electronic device according to claim 11, wherein
in the first preparation step, a first wafer having a plurality of the first structures in a first element region is prepared,
in the second preparation step, a second wafer having a plurality of the second structures in a second element region is prepared, and
in the third preparation step, a third wafer having a plurality of the third base bodies in a third element region is prepared,
the method further comprising:
a step of dicing the first wafer, the second wafer, and the third wafer stacked on each other into a plurality of electronic devices.

15. The method of manufacturing an electronic device according to claim 14, wherein
the first alignment mark is formed outside the first element region of the first wafer, and
the second alignment mark is formed outside the second element region of the second wafer.

* * * * *